US010039195B2

(12) United States Patent
Elmieh et al.

(10) Patent No.: US 10,039,195 B2
(45) Date of Patent: Jul. 31, 2018

(54) FABRICATION OF INTRA-STRUCTURE CONDUCTIVE TRACES AND INTERCONNECTS FOR THREE-DIMENSIONAL MANUFACTURED STRUCTURES

(71) Applicant: Facebook, Inc., Menlo Park, CA (US)

(72) Inventors: Baback Elmieh, Palo Alto, CA (US); Saurabh Palan, Mountain View, CA (US); Rex Wenters Crossen, Piedmont, CA (US); Alexandre Jais, San Francisco, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 14/921,868

(22) Filed: Oct. 23, 2015

(65) Prior Publication Data

US 2016/0120040 A1    Apr. 28, 2016

Related U.S. Application Data

(60) Provisional application No. 62/067,674, filed on Oct. 23, 2014.

(51) Int. Cl.
*B29C 64/00*     (2017.01)
*H05K 3/46*      (2006.01)
(Continued)

(52) U.S. Cl.
CPC ........... *H05K 3/4679* (2013.01); *B29C 64/00* (2017.08); *G05B 19/4099* (2013.01);
(Continued)

(58) Field of Classification Search
USPC ...................................... 427/97.3, 98.4, 98.5
See application file for complete search history.

(56) References Cited

U.S. PATENT DOCUMENTS 1,834,123 A * 12/1931 Erdle ..................... B21D 26/02
                                                164/119
6,100,178 A    8/2000 Todd et al.
(Continued)

FOREIGN PATENT DOCUMENTS

EP     1209959 A2    5/2002
EP     1886793 A1    2/2008
(Continued)

OTHER PUBLICATIONS

Biggs. The rabbit proto can print real electronics. Tech Crunch. Apr. 25, 2014. video timestamp 0:40-0:52. http://techcrunch.com/2014/04/25/the-rabbit-proto-can-print-real-electronics/.
(Continued)

*Primary Examiner* — Brian K Talbot
(74) *Attorney, Agent, or Firm* — Fenwick & West LLP

(57) ABSTRACT

A method for forming a three-dimensional object with at least one conductive trace comprises providing an intermediate structure that is generated (e.g., additively or subtractively generated) from a first material in accordance with a model design of the three-dimensional object. The intermediate structure may have at least one predefined location for the at least one conductive trace. The model design includes the at least one predefined location. Next, the at least one conductive trace may be generated adjacent to the at least one predefined location of the intermediate structure. The at least one conductive trace may be formed of a second material that has an electrical and/or thermal conductivity that is greater than the first material.

17 Claims, 15 Drawing Sheets

(51) Int. Cl.
*G05B 19/4099* (2006.01)
*H05K 1/02* (2006.01)
*H05K 1/11* (2006.01)
*H05K 3/40* (2006.01)
*H05K 1/16* (2006.01)
*H05K 1/18* (2006.01)
*H05K 3/00* (2006.01)
*H05K 3/10* (2006.01)
*B29C 33/00* (2006.01)
*B29C 64/10* (2017.01)
*B29C 33/44* (2006.01)
*B29C 43/36* (2006.01)
*B33Y 10/00* (2015.01)
*B33Y 30/00* (2015.01)
*B33Y 70/00* (2015.01)
*H05K 1/09* (2006.01)
*H05K 3/12* (2006.01)
*H05K 3/26* (2006.01)

(52) U.S. Cl.
CPC ........... *H05K 1/0284* (2013.01); *H05K 1/111* (2013.01); *H05K 1/162* (2013.01); *H05K 1/183* (2013.01); *H05K 3/0088* (2013.01); *H05K 3/101* (2013.01); *H05K 3/103* (2013.01); *H05K 3/4007* (2013.01); *B29C 33/0016* (2013.01); *B29C 33/448* (2013.01); *B29C 64/10* (2017.08); *B29C 2043/3668* (2013.01); *B33Y 10/00* (2014.12); *B33Y 30/00* (2014.12); *B33Y 70/00* (2014.12); *G05B 2219/35134* (2013.01); *G05B 2219/49007* (2013.01); *H05K 1/095* (2013.01); *H05K 1/097* (2013.01); *H05K 3/0005* (2013.01); *H05K 3/0014* (2013.01); *H05K 3/0044* (2013.01); *H05K 3/1258* (2013.01); *H05K 3/26* (2013.01); *H05K 2201/0329* (2013.01); *H05K 2201/098* (2013.01); *H05K 2201/10265* (2013.01); *H05K 2203/0126* (2013.01); *H05K 2203/0228* (2013.01); *H05K 2203/0292* (2013.01); *H05K 2203/0514* (2013.01); *H05K 2203/06* (2013.01); *H05K 2203/0783* (2013.01); *H05K 2203/082* (2013.01); *H05K 2203/085* (2013.01); *H05K 2203/1115* (2013.01); *H05K 2203/1194* (2013.01); *H05K 2203/128* (2013.01); *H05K 2203/143* (2013.01); *H05K 2203/163* (2013.01); *H05K 2203/175* (2013.01); *H05K 2203/302* (2013.01); *H05K 2203/308* (2013.01)

(56) References Cited

U.S. PATENT DOCUMENTS 6,833,511 B2 12/2004 Uchinono et al.
7,516,437 B1 4/2009 Kannan et al.
7,520,740 B2 4/2009 Wahlstrom et al.
8,033,014 B2 10/2011 Yu et al.
2002/0062987 A1 5/2002 Uchinono et al.
2010/0006252 A1* 1/2010 Roby ................ B22C 7/02
  164/15
2010/0314041 A1 12/2010 Ng et al.
2011/0045577 A1 2/2011 Bruzewicz et al.
2011/0253435 A1 10/2011 Huang et al.
2012/0065755 A1 3/2012 Steingart et al.
2012/0309127 A1 12/2012 Farooq et al.
2013/0073073 A1 3/2013 Pettis
2013/0215197 A1* 8/2013 Hays ................ B41J 2/161
  347/40
2013/0326457 A1 12/2013 Macmunn et al.
2014/0054795 A1 2/2014 Romig et al.
2014/0178588 A1 6/2014 Swanson et al.
2014/0268604 A1* 9/2014 Wicker .............. B29C 70/885
  361/760
2014/0272522 A1 9/2014 Pugh et al.
2015/0077215 A1* 3/2015 Ranky ................ B29C 70/88
  338/47
2016/0297104 A1* 10/2016 Guillemette ........ B29C 64/106

FOREIGN PATENT DOCUMENTS

EP 2779272 A1 9/2014
EP 1886793 * 6/2017
WO WO 2015/127271 A1 8/2015

OTHER PUBLICATIONS

International search report and written opinion dated Feb. 2, 2016 for PCT/US2015/057114.
Printed circuits as part of a 3-D printed object (video). Slashdot. May 27, 2014. Video timestamp 9:20-9:58. http://hardware.slashdot.org/story/14/05/27/2044212/printed-circuits-as-part-of-a-3-d-printed-object-video.
U.S. Appl. No. 14/921,882, filed Oct. 23, 2015, Elmieh et al.
Cheng, et al. Microfluidic stretchable RF electronics. Lab Chip, 2010,10, 3227-3234. DOI: 10.1039/C005159D.
International search report and written opinion dated Jan. 14, 2016 for PCT/US2015/057236.
Patrick, et al. DNA Assembly in 3D Printed Fluidics. 3D-Printing of Milli and Microfluidics for Synthetic Biology Applications. 2015. http://matter.media.mit.edu/tools/details/dna-assembly-in-3d-printed-fluidics.
Patrick, et al. Wanderers: Living Mushtari. 2015. http://matter.media.mit.edu/environments/details/wanderers-living-mushtari.
Wu, et al. 3D-printed microelectronics for integrated circuitry and passive wireless sensors. Microsystems & Nanoengineering 1, Article No. 15013 (2015) doi:10.1038/micronano.2015.13.
European Patent Office, Extended European Search Report and Opinion, EP Patent Application No. 15852910.7, dated May 23, 2018, seven pages.

* cited by examiner

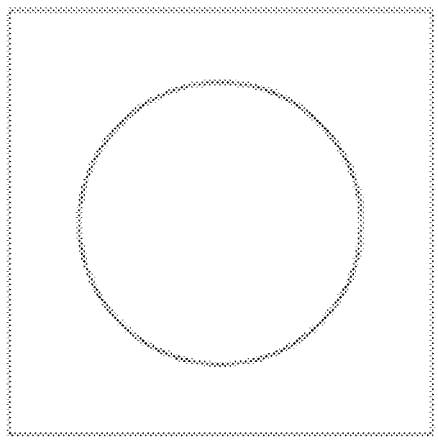
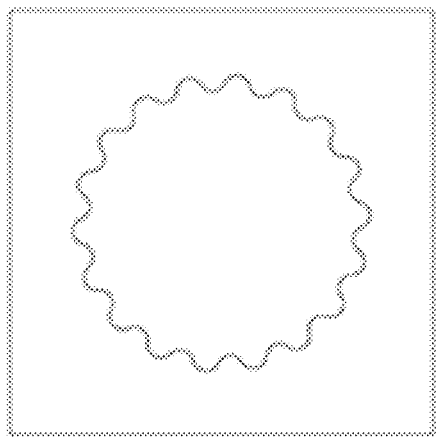
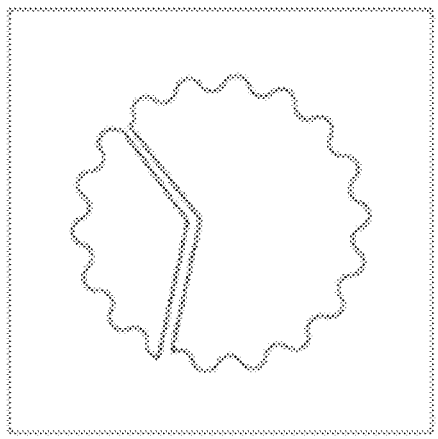
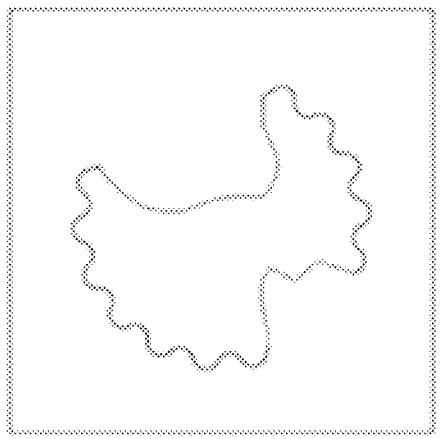
FIG. 5

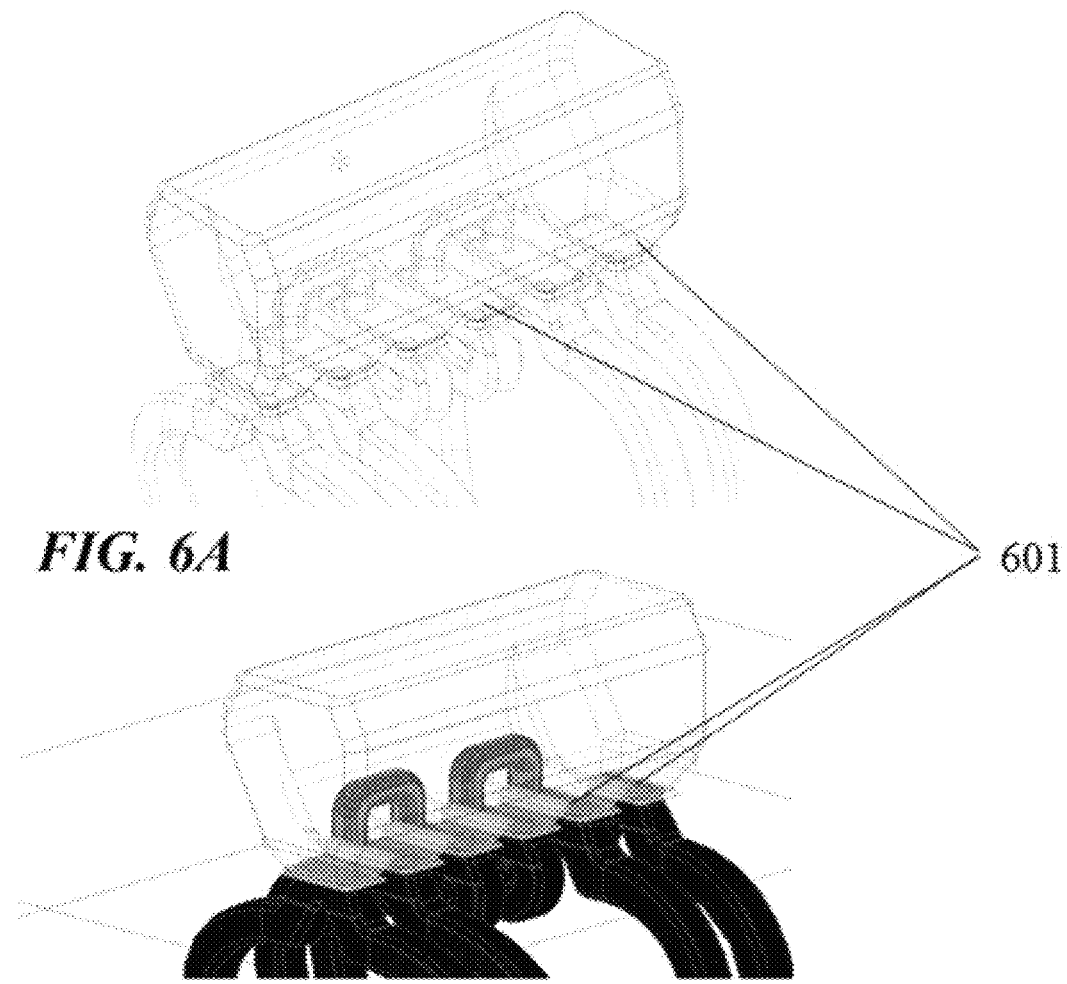
*FIG. 6A*
*FIG. 6B*
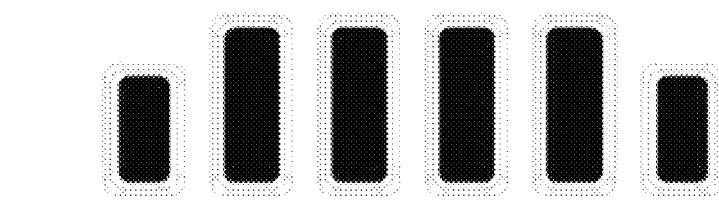
*FIG. 6C*

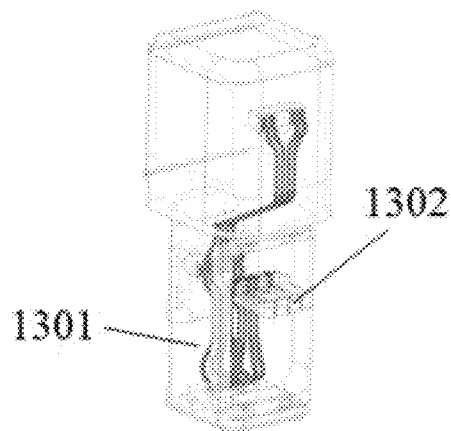
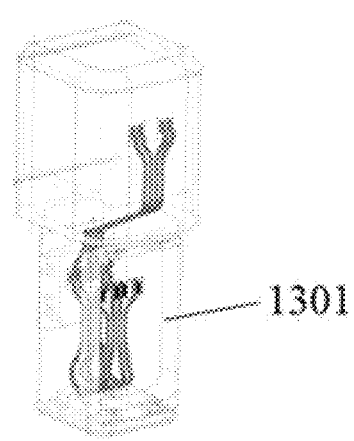
*FIG. 13A*   *FIG. 13B*
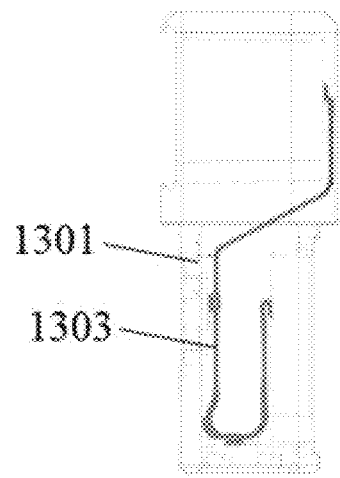
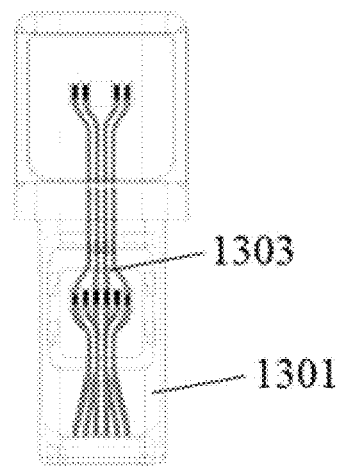
*FIG. 13C*   *FIG. 13D*
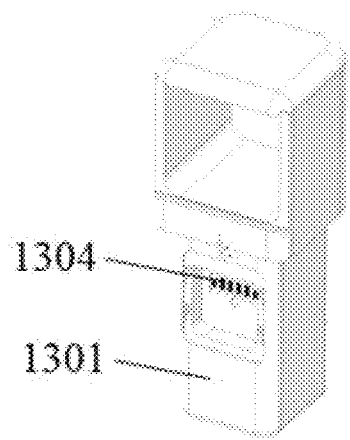
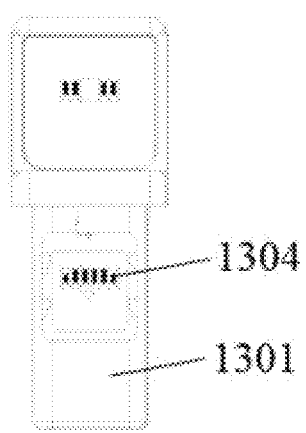
*FIG. 13E*   *FIG. 13F*

FABRICATION OF INTRA-STRUCTURE CONDUCTIVE TRACES AND INTERCONNECTS FOR THREE-DIMENSIONAL MANUFACTURED STRUCTURES

CROSS-REFERENCE

This application claims priority to U.S. Provisional Patent Application Ser. No. 62/067,674, filed Oct. 23, 2014, which is entirely incorporated herein by reference.

BACKGROUND

Three-dimensional (3D) structure manufacturing is a rapidly advancing technology used for a variety of applications, including architecture, industrial design, automotive manufacture, medicine, fashion, and electronics, especially through advances and popularization of 3D printing. Unfortunately, while many advances have been made in the field, solutions that enable 3D printing of conductive materials suffer from a number of issues including cost, low conductivity, and manufacturing challenges.

SUMMARY

Recognized herein is the need for methods for fabricating intra-structure conductive traces and interconnects for three-dimensional (3D) structures, such as three-dimensional manufactured (e.g., 3D printed, machined, molded) structures. The present disclosure provides methods that can be used to fabricate intra-structure conductive traces and interconnects for three-dimensional (3D) printed structures. Such structures may be used in various settings, such as generating interconnects in three-dimensional manufactured (e.g., 3D printed, machined, molded) objects, which may be used to build larger devices or systems.

An aspect of the present disclosure provides a method for forming a three-dimensional object with at least one conductive trace, comprising (a) providing an intermediate structure that is generated from a first material in accordance with a model design of the three-dimensional object, wherein the intermediate structure has at least one predefined location for the at least one conductive trace, and wherein the model design includes the at least one predefined location; and (b) generating the at least one conductive trace adjacent to the at least one predefined location of the intermediate structure, which at least one conductive trace is formed of a second material that has an electrical and/or thermal conductivity that is greater than the first material, thereby forming the three-dimensional object with the at least one conductive trace. In some embodiments, the intermediate structure is a nascent three-dimensional object that yields the three-dimensional object. In some embodiments, the intermediate structure is generated using a three-dimensional manufacturing process, such as an additive or subtractive process. In some embodiments, the intermediate structure is additively or subtractively generated. In some embodiments, (a) comprises additively generating the intermediate structure. In some embodiments, (a) comprises subtractively generating the intermediate structure.

In some embodiments, the first material is a polymeric, ceramic, organic, composite, metallic, mineral or living material. In some embodiments, the second material is a metal, metal filled polymer or organic conductive material.

In some embodiments, (b) comprises injecting a solution comprising the second material adjacent to the at least one predefined location. In some embodiments, the method further comprises curing the solution after injecting the solution. In some embodiments, the solution is cured by directing an electrical current through the solution to generate Joule heating. In some embodiments, the at least one predefined location is a channel, and wherein in (b) the solution is injected in at least a portion of the channel. In some embodiments, (b) comprises providing an injection structure having an injection channel in fluid communication with the at least one predefined location, and injecting the solution to the at least one predefined location through the injection channel of the injection structure. In some embodiments, the method further comprises removing the injection structure subsequent to injecting the solution to the at least one predefined location. In some embodiments, the method further comprises using one or more sensors adjacent to the injection structure to monitor one or more injection parameters while injecting the solution. In some embodiments, the method further comprises adjusting the one or more injection parameters while injection the solution. In some embodiments, the method further comprises ejecting the solution using the injection structure.

In some embodiments, the second material has an electrical conductivity that is greater than an electrical conductivity of the first material. In some embodiments, the method further comprises, prior to (b), disposing a connector adjacent to at least a portion of the at least one predefined location, and subsequently generating the at least one conductive trace adjacent to the at least one predefined location, thereby bringing the at least one conductive trace in contact with the connector. In some embodiments, the method further comprises bringing a connector in contact with the at least one conductive trace through a port in the intermediate structure.

In some embodiments, the at least one conductive trace comprises a plurality of conductive traces. In some embodiments, a given one of the plurality of conductive traces is electrically isolated from another one of the plurality of conductive traces. In some embodiments, each of the plurality of conductive traces includes a contact pad at an external surface of the intermediate structure for electrical and/or thermal connectivity.

In some embodiments, the at least one conductive trace is within the intermediate structure, and wherein (b) comprises exposing at least a portion of the at least one conductive trace. In some embodiments, the model design includes one or more structural constraints for the at least one predefined location. In some embodiments, the method further comprises bringing an electrical circuit in electrical contact with the at least one conductive trace.

In another aspect, the present disclosure provides a system for forming a three-dimensional object with at least one conductive trace, comprising computer memory comprising instructions for forming the three-dimensional object from an intermediate structure that is additively or subtractively generated from a first material in accordance with a model design of the three-dimensional object, wherein the intermediate structure has at least one predefined location for the at least one conductive trace, and wherein the model design includes the at least one predefined location; and one or more computer processors operatively coupled to the computer memory, wherein the one or more computer processors are programmed to execute the instructions to generate the at least one conductive trace adjacent to the at least one predefined location of the intermediate structure, which at least one conductive trace is formed of a second material that has an electrical and/or thermal conductivity that is greater than the first material, thereby forming the three-dimensional object with the at least one conductive trace.

In some embodiments, the system further comprises a three-dimensional manufacturing module operatively coupled to the one or more computer processors, wherein the three-dimensional manufacturing module additively or subtractively generates the intermediate structure in accordance with the model design. In some embodiments, the at least one predefined location is a channel in the intermediate structure. In some embodiments, the model design includes one or more structural constraints for the at least one predefined location.

Another aspect of the present disclosure provides a non-transitory computer-readable medium comprising machine-executable code that, upon execution by one or more computer processors, implements a method for forming a three-dimensional object with at least one conductive trace, the method comprising: (a) providing an intermediate structure that is additively or subtractively generated from a first material in accordance with a model design of the three-dimensional object, wherein the intermediate structure has at least one predefined location for the at least one conductive trace, and wherein the model design includes the at least one predefined location; and (b) generating the at least one conductive trace adjacent to the at least one predefined location of the intermediate structure, which at least one conductive trace is formed of a second material that has an electrical and/or thermal conductivity that is greater than the first material, thereby forming the three-dimensional object with the at least one conductive trace.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "figure" and "FIG." herein), of which:

FIG. 5 shows various examples of cavity wall surfaces;

FIGS. 6A-6C show various views of an example of an intermediate structure with cavities having rectangular contact areas;

FIGS. 13A-13F show various views of an example view of the 3D-printed object of FIG. 2 with the breakable structures removed;

DETAILED DESCRIPTION

Figure 1:
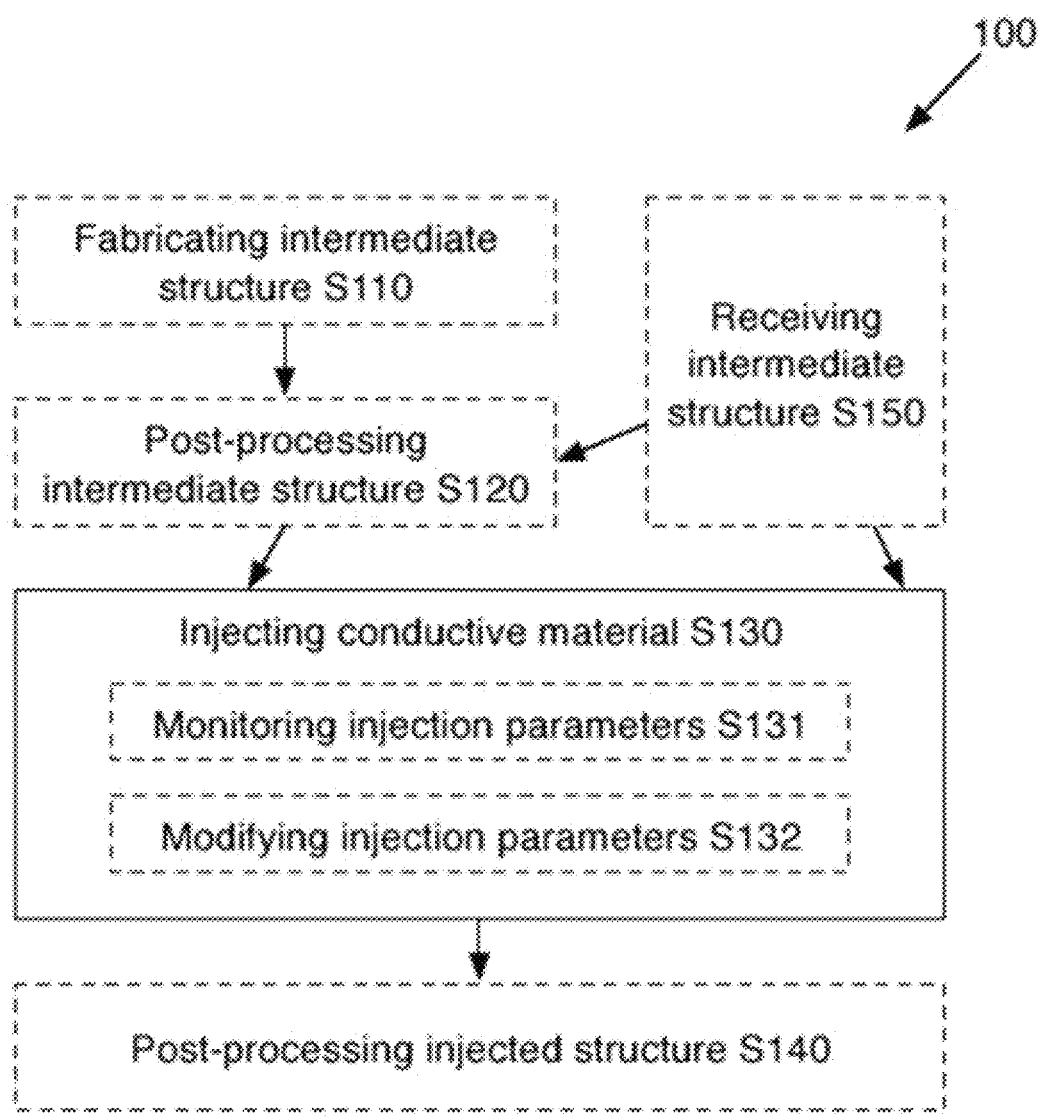
FIG. 1 is a flowchart view of a method of an invention embodiment.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

The term "three-dimensional" structure or object, as used herein, generally refers to any structure or object that is generated by a three-dimensional (3D) manufacturing approach, such as an additive or subtractive approach (e.g., additive or subtractive manufacturing). A 3D object may have one or more sub-structures, such as at least 1, 2, 3, 4, 5, 6, 7, 8, 9, 10, 20, 30, 40, 50, or 100 individual structures. The 3D object may be a final product or may itself be an intermediate product. In the latter case, the 3D object may be combined with other objects, some of which may be three-dimensional manufactured (e.g., 3D printed, machined, molded) objects, to yield a larger object as a final product.

In additive manufacturing, the 3D object may be formed using 3D printing in a layer-by-layer manner, such as layer-by-layer deposition, or layer-by-layer solidification of photopolymer resin in a vat. In subtractive manufacturing, the 3D object may be formed by removing material from a substrate, such as by etching, milling or drilling. Other manufacturing processes suitable for building three-dimensional structures include molding, casting, forming, joining, casting.

The term "intermediate structure," as used herein, generally refers to any structure (or object) that is generated by a three-dimensional manufacturing process that may be used to yield a final or subsequent three-dimensional structure. The intermediate structure may be generated by an additive process or subtractive process or any other process capable of generating three-dimensional structures.

The term "trace," as used herein, general refers to a component or element that is electrically conductive, thermally conductive, or both electrically conductive and thermally conductive. In some examples, a conductive trace is a conductive structure, channel, wire, or pathway. A trace may be capable of electrically connecting together circuit components. For example, traces may include copper or gold when the substrate is a printed circuit board and may be copper, gold, or printed deposit in a flex circuit. Traces may also be comprised of metallic materials, nonmetallic materials, or mixtures thereof. A trace may include, for example, one or more metals selected from copper, aluminum, beryllium, magnesium, molybdenum, zinc, cobalt, cadmium, lithium, ruthenium, lead, bismuth, tin, indium, tungsten, iron, nickel, ruthenium, rhodium, palladium, silver, osmium, iridium, platinum, and gold. A trace may include a non-metallic material, such as, for example, silicone, epoxy resin, or Arabic gum, or an organic conductive material.

A trace may have a regular or irregular cross-section. In some examples, a trace has a cross-section that is circular, triangular, square, rectangular, pentagonal, or hexagonal, or partial shapes or combinations thereof. In some examples, a trace can have a width that is from about 50 nanometers (nm) to 10000 micrometers (microns), or about 100 nm to 1000 microns, or 200 nm to 100 microns, or 300 nm to 50 microns. In some examples, the width can be at least about 10 nm, 50 nm, 100 nm, 500 nm, 1 micron, 10 microns, 50 microns, 100 microns, 500 microns, or 1000 microns. A trace can have a length that spans a dimension (e.g., length, width or height) of a 3D object, or is a portion of the dimension of the 3D object. For example, the trace can be up to about 90%, 80%, 70%, 60%, 50%, 40%, 30%, 20%, 10%, or 5% of a length of the 3D object.

The term "metallic," as used herein, generally refers to a material that includes a metal or has an electrical and/or thermal conductivity of a metal. In some examples, a metallic material includes one or more metals.

The present disclosure provides methods and systems for forming 3D objects with one or more conductive traces. Methods and systems of the present disclosure can advantageously enable the formation of 3D objects that can have one or more conductive traces or metallization layers for various uses, such as for use as electronic or mechanical devices or components of electronic or mechanical devices.

FIG. 1 shows a method 100 for fabricating intra-structure conductive traces for three-dimensional (3D) manufactured structures. The method 100 may include fabricating an intermediate structure S110, post-processing the intermediate structure S120, injecting conductive material into the intermediate structure S130, and post-processing the injected structure S140. Additionally or alternatively to operations S110 and S120, the method 100 may include receiving an intermediate structure S150. In some situations, operation S110 may be precluded and method 100 may commence at operation S120 upon receiving the intermediate structure in operation S150.

The method 100 may function to enable the integration of conductive traces, interconnects or other conductive structures with structures fabricated using three-dimensional structure manufacturing (e.g., 3D printing, computer numerical control (CNC) machining, or molding). This integration may open a number of possibilities for three-dimensional structure manufacturing—conductive structures may be used to provide connections to electronics integrated in or coupled to three-dimensional manufactured (e.g., 3D printed, machined, molded) structures, for example, by either transmitting power through low resistance lines, or information through high bandwidth signal lines. In an example, one or more conductive structures are provided for universal serial bus (USB) transmission, such as conductive structures for a USB 2.0 data transmission protocol using two power lines and two signal lines. Such approach may expand capabilities of three-dimensional manufactured structures (e.g., a conductive wire mesh inside of an object may be used as part of a sensor to detect touch, temperature, or object stresses, a conductive structure may be used as an antenna), and to create electronic components and/or circuits (e.g., RLC circuits).

Many current methods for integrating conductive traces with three-dimensional manufactured structures fabricate the conductive traces in a manner similar to the fabrication of the non-conductive parts of three-dimensional manufactured structures. In some cases, conductive inks are deposited or formed layer-by-layer using a liquid that cures or solidifies shortly after deposition, or using other curing methods (including but not limited to heat, ultraviolet (UV) radiation, or humidity). In these cases, the ink on a first layer may need to be cured before addition of a second layer of ink. This requirement may slow the process as well as cause electrical conductivity issues between layers (e.g., electrical contact between layers may not be as good as contact across a single layer). In another case, conductive inks are deposited in open channels present on the surface of a three-dimensional manufactured structure, filling the channels or directly on the surface, for example, if the trace can be structurally sound by itself. This method may reduce the issues present in inter-layer conductivity, but is limited mostly to two-dimensional structures and, like the previous method, may result in exposed conductive traces unless additional 3D printing or other manufacturing is performed after trace deposition.

The method 100 advantageously enables conductive materials to be integrated with three-dimensional manufactured structures in a truly three-dimensional manner, while overcoming many of the issues present in current methods, including low conductivity. The conductive traces created as part of the method 100 may have resistivities lower $10^{-2}$ ohm meter ($\Omega$ m), $10^{-3}$ $\Omega$m, $10^{-4}$ $\Omega$m, $10^{-5}$ $\Omega$m, $10^{-6}$ $\Omega$m, or $10^{-7}$ $\Omega$m. Such resistivities may be as measured at 20° C. In the method 100, a structure is printed with one or more cavities where conductive material is desired (S110). The structure may then be post-processed (if necessary or desired) to prepare the structure for conductive material injection (S120). Once the structure is prepared, conductive material is injected into the one or more cavities of the structure (S130). The structure may then be post-processed to cure the conductive material and/or expose the traces where desired (S140) to create interconnects, such as, for example, in the manner described in FIGS. 10A-10E. The result of the method 100 is a three-dimensional manufactured structure comprising one or more integrated intra-structure conductive traces.

Figure 2:
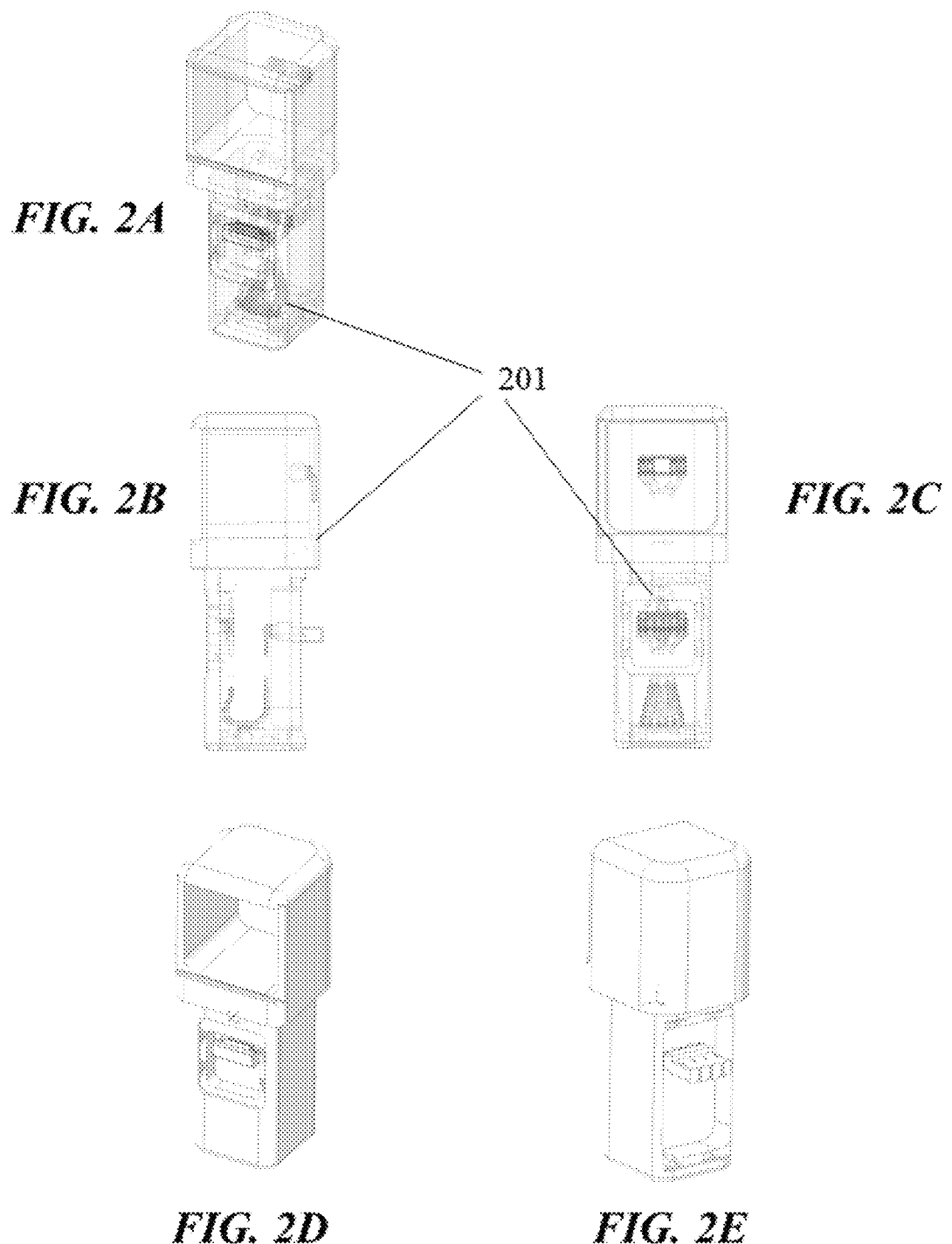
FIGS. 2A-2E show various views of an example of a three-dimensional (3D) printed structure with injected conductive traces.

An example three-dimensional manufactured structure (or object) is as shown in FIGS. 2A-2E. In this example structure, the conductive traces may be used to connect electronics modules that may be coupled to the three-dimensional manufactured structure. FIG. 2A is a transparent isometric view of the three-dimensional manufactured structure. FIG. 2B is a transparent side view of the three-dimensional manufactured structure. FIG. 2C is a transparent front view of the three-dimensional manufactured structure. FIGS. 2D and 2E are isometric front and back views, respectively, of the three-dimensional manufactured structure. An intermediate structure 201 for conductive traces is shown in FIGS. 2A-2C. The intermediate structure 201 may form at least a portion of a final 3D object or structure to be generated.

Operation S110 may include fabricating an intermediate structure (i.e., a structure designed for, but prior to conductive injection). Operation S110 may function to create a three-dimensional structure containing one or more predefined locations, such as cavities or channels, intended for the injection of conductive material. The one or more predefined locations may be part of a model design of the 3D object or structure. The model design may be a computer design or computer-aided design, such as a computer-aided design (CAD). The model design may be stored in computer memory. In some cases, the model design may include computer-executable instructions for generating the 3D object. The model design may be used by a 3D printing system to generate the intermediate structure with the one or more predefined locations.

Intermediate structures fabricated during operation S110 can also perform a variety of other functions in addition to receiving the conductive material including but not limited to facilitating the injection of conductive material, creating the surface for high quality interconnects, splitting conductive line in two distinct lines and fixturing either of an apparatus (e.g., sensor or injection device) on the parts or on other fixtures to ease the processing of parts or allow the batching of multiple parts at the same time during the operations of method 100. Those structures can be temporary structures, which may be removed during operation S140 to allow, for example, the creation of interconnect structures or to remove the fixturing structures before shipping the 3D object to a user.

An example implementation of temporary structures in a 3D-printed object is shown in FIGS. 13A-13F. FIG. 13A is an isometric view of a substrate 1301 filled with conductive material and with temporary structures 1302. The substrate 1301 may be a 3D-printed object. FIG. 13B is an isometric view of the substrate 1301 filled with conductive material 1303 and with the temporary structures 1302 removed. FIGS. 13C and 13D are side and front views, respectively, of the substrate 1301 filled with conductive material 1303 and with the temporary structures 1302 removed. The substrate 1301 in FIGS. 13A-13D is shown as transparent to show the conductive material 1303. FIGS. 13E and 13F show solid isometric and front views, respectively, of the substrate 1301 with connector pads 1304.

Some embodiments provide a collection of temporary intermediate structures, e.g. functional tabs and cavities with predetermined structural constraint ensembles that may be added locally at the beginning, at the end, at predefined locations, and/or at an arbitrary number of locations along the length of a cavity. A temporary intermediate structure may be removable, such as after injection. The cavity and tab design may allow the creation of high quality contacts arranged in an array by raising locally the cavity and changing its geometry to have an optimal contact area versus cross section. The fracture of the base of the tab may allow revealing the connector pad. If the cavity is routed through the removable portion of the structure, the fracture can then remove part of the length of the cavity, creating a break in a line, thus allowing the isolation of two portions of that line. An example of such geometry is presented in FIGS. 10A-10E. The cavity geometry can be constrained in the tab to allow the docking and fixturing of injection or monitoring apparatus, allowing the connection to an injection pump or syringe (see, e.g., FIG. 11). Additionally, the geometry of the tab itself may be configured to allow handling by either a hand or other manipulating unit of an operator (e.g., human or robot operator), a tool or any other apparatus, either for processing or to attach sensors, as shown, for example, in FIGS. 12A-12C.

Figure 12A:
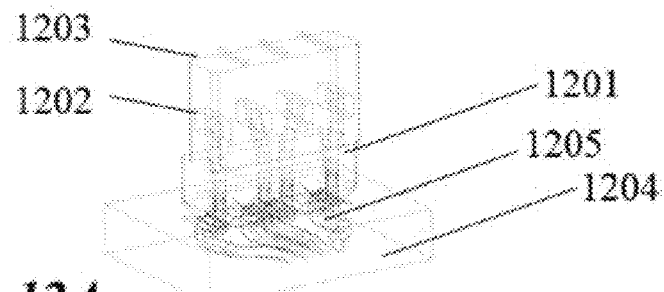
FIGS. 12A-12C show various views of an example of a breakable structure with an ejection port and a fixture for a sensor.
Figure 12B:
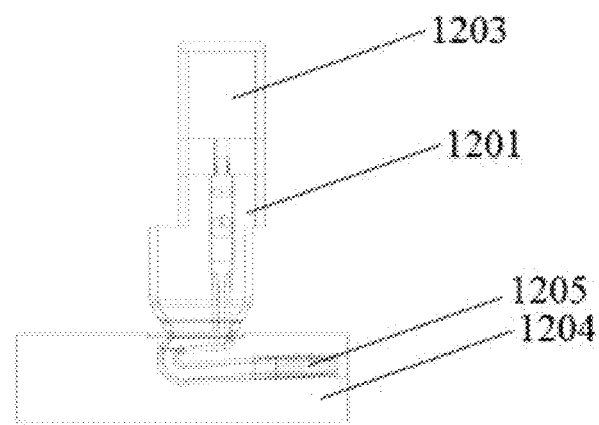
Figure 12C:
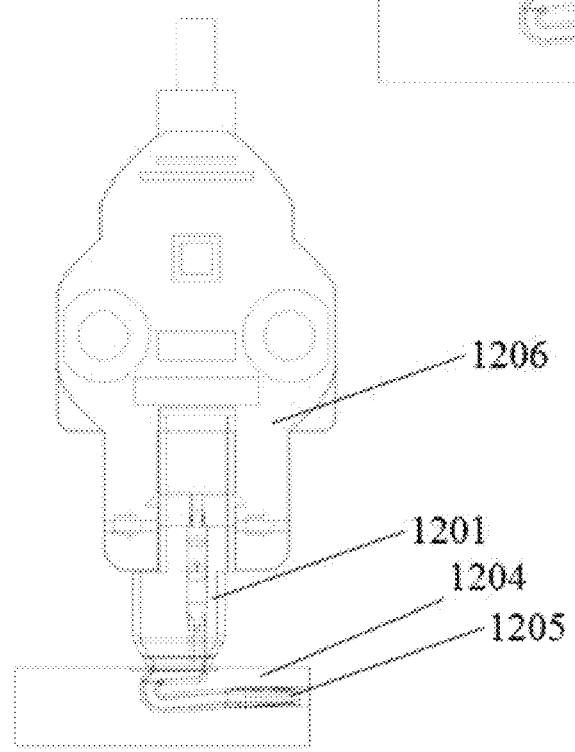

FIGS. 12A-12C show various views of an example of a breakable structure 1201 with an ejection port 1202 and a fixture 1203 for holding or supporting one or more sensors. FIG. 12A is an isometric view and FIG. 12B is a side view. The breakable structure 1201 is adjacent to an intermediate structure 1204 with a plurality of cavities 1205 for a conductive material. The fixture 1203 may hold or support one or more sensors, such as optical sensors, temperature sensors, pressure sensors, or chemical sensors. FIG. 12C is a side view of the breakable structure 1201 and a photomicrosensor 1206 adjacent thereto. The photomicrosensor may be used to detect a presence of conductive material at an end of a cavity in the breakable structure 1201 during a process of injecting conductive material into the cavities 1205 of the intermediate structure 1204.

Figure 10A:
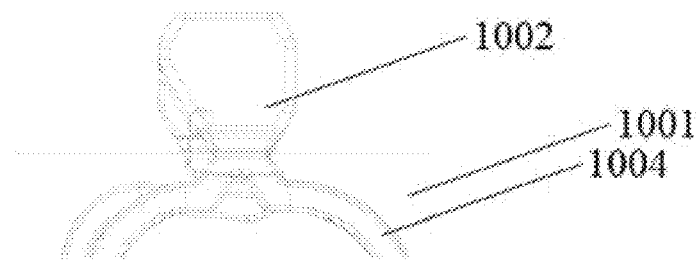
FIGS. 10A-10E schematically illustrate a method for exposing contact points using a breakable tab and intermediate structures.
Figure 10B:
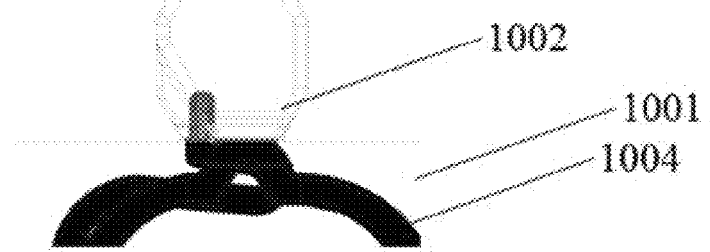
Figure 10C:
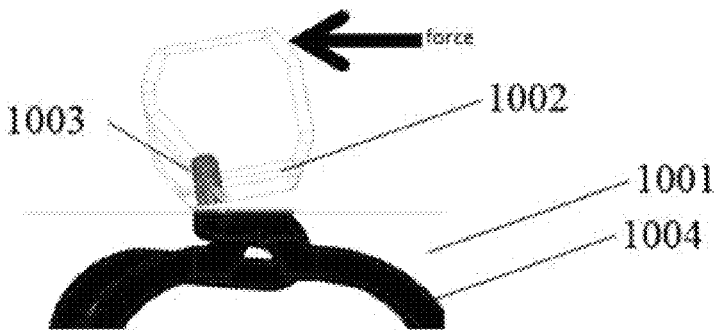
Figure 10D:
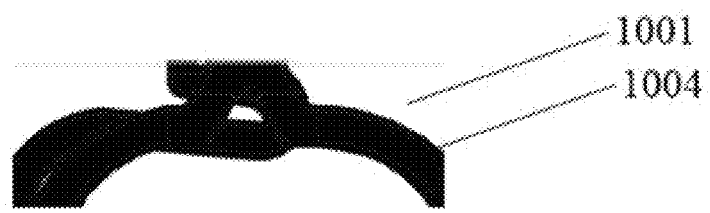
Figure 10E:
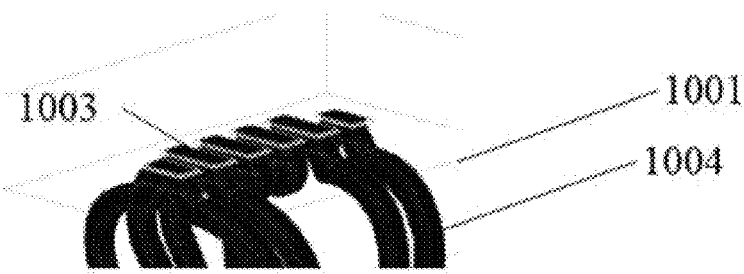

FIGS. 10A-10E schematically illustrates a method for forming contact points in an intermediate structure. With reference to FIG. 10A, a temporary intermediate structure 1001 for pad creation and line breaking is provided in an unfilled state. A tab 1002 rests adjacent to the intermediate structure 1001. The intermediate structure 1001 includes a plurality of channels 1004. Next, the channels 1004 of the intermediate structure 1001 are filled with a conductive material, as shown in FIG. 10B. Next, the tab 1002 is broken, such by a machine or operator applying force to the tab 1002, which generates a controlled fracture at a base of the tab 1002, as shown in FIG. 10C. Milling, drilling or other operations can be performed to remove a material of the tab. This can provide a contact area with surface properties (e.g., roughness) that is suitable for a given purpose, such as electrical contact. This forms a pad 1003 and breaking of line, as shown in FIG. 10D (side view) and FIG. 10E (perspective view). FIG. 10E shows multiple pads 1003. The pads 1003 and filled channels 1004 may be electrically and/or thermally isolated from one another.

The tab 1002 may provide fluid access between multiple channels of the intermediate structure 1001. When the intermediate structure 1001 is filled and the tab 1002 is broken, the resulting pads 1003 may be isolated from one another.

The tab 1002 can have various benefits. For example, the tab 1002 can generate pads 1003 that are electrically isolated form one another. The pads 1003 may be used for electrical and/or thermal contact from a device or system that is external to the intermediate structure 1001. In some examples, the pads 1003 are used to provide electrical contact to a circuit that is external to the intermediate structure 1001.

The intermediate structure 1001 can include at least 1, 2, 3, 4, 5, 6, 7, 8, 9, 10, 20, 30, 40, 50, 100, or 500 pads 1003. The intermediate structure 1001 can include at least 1, 2, 3, 4, 5, 6, 7, 8, 9, 10, 20, 30, 40, 50, 100, or 500 channels 1004.

With reference to FIG. 1, operation S110 may also include the fabrication of mechanical structures allowing the docking and proper connection of electronic circuitry that may work in conjunction with the printed structures.

The present disclosure also provides methods for manufacturing (e.g., printing, machining, molding) locations, such as channels and/or cavities that may welcome or accommodate electronic circuitry contained in injection molded modules with male spring loaded connectors at their bottoms (e.g., pogo pins or spring fingers). The locations may be predefined or predetermined. Once the 3D object is processed, a module may be inserted in a cavity with connectors that are in contact with interconnects created through method 100. Mechanical attachment mechanisms may also be printed along with the cavity to maintain electrical communication between the module and the interconnect. Such mechanisms can be or include, without limitation, a bar flexure mechanism with a printed feature to allow docking in the cavity, or latches on the side of the cavity to allow an injection molded door to slide and lock the module insert.

Figure 14A:
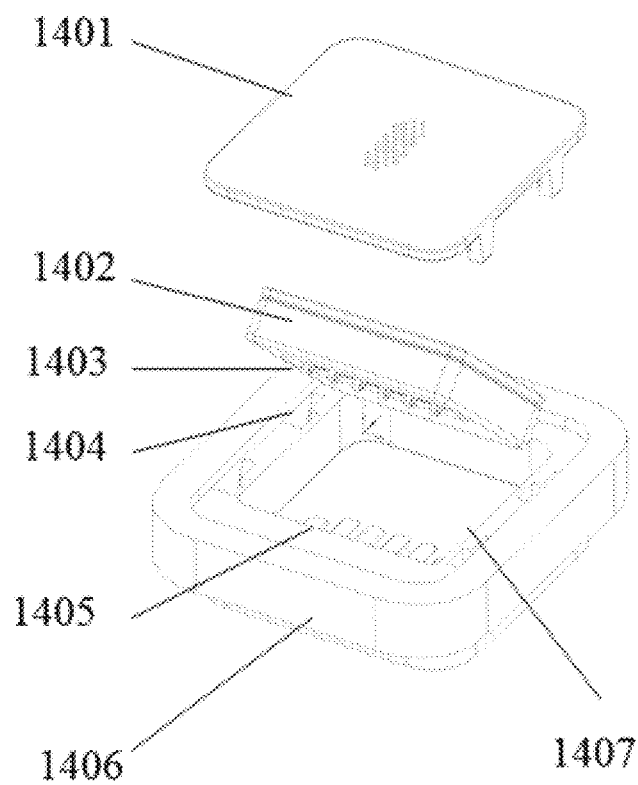
FIGS. 14A and 14B show an example of an apparatus with circuitry in a self-contained module making contact with conductive structures within a three-dimensional manufactured (e.g., 3D printed, machined, molded) object.
Figure 14B:
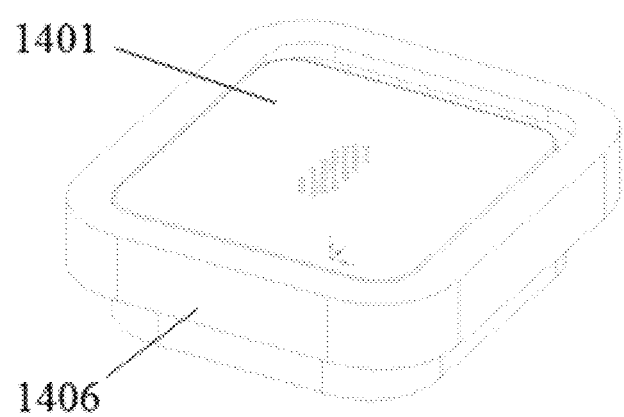

FIG. 14A shows an example of an apparatus comprising a self-contained module making contact with conductive structures within a three-dimensional manufactured object. The apparatus of the illustrated example includes a door 1401, self-contained circuitry 1402, spring-loaded connectors 1403, mechanical docking features 1404, conductive material pads 1405, a three-dimensional manufactured substrate 1406 with a conductive structure, and a cavity for circuitry 1407. FIG. 14B shows the self-contained circuitry 1402 docked in the three-dimensional manufactured substrate 1406 with door 1401 inserted. Here, spring-loaded connectors 1403 are making contact with conductive material pads 1405.

Operation S110 may include fabricating the intermediate structure by 3D printing the structure. Operation S110 may additionally or alternatively include fabricating an intermediate structure by any other additive manufacturing process or in any suitable manner (e.g., by injection molding, CNC milling, casting or waterjet cutting).

Operation S110 may include fabricating the intermediate structure using a laser-based stereolithography-based 3D printing technique (SLA) or a masked image projection-based SLA technique. Operation S110 may additionally or alternatively include fabricating the intermediate structure using extrusion techniques (e.g., fused deposition modeling or syringe deposition), granular techniques (e.g., laser sintering), powder bed techniques, inkjet head techniques (e.g., MultiJet printing, Polyjet), laminated object manufacturing techniques, and/or any other additive manufacturing techniques.

Operation S110 may include fabricating the intermediate structure with photopolymers, but may additionally or alternatively include fabricating the intermediate structure with a polymeric material (e.g., a thermoplastic or heat curable polymer), ceramic, sugar, concrete, glass, organic composite, metallic material, mineral, living material (e.g., living tissue) or any other suitable material.

Operation S110 may include fabricating the intermediate structure according to a set of manufacturing constraints. The manufacturing constraints may include both primary constraints (i.e., constraints inherent to the intermediate structure fabrication process) and secondary constraints (i.e., constraints relating to the conductive material injection process). Primary constraints may differ based on the method of fabrication. Examples of primary constraints include vertical resolution of a layer-by-layer manufacturing process, planar resolution of a layer-by-layer manufacturing process, and tolerance variation from unit-to-unit of the manufacturing process. Secondary constraints may include material constraints, structural constraints, and/or any other constraints on the intermediate structure fabrication process relevant to conductive material injection.

Some examples of material constraints include reactivity constraints (e.g., the material of the intermediate structure that comes into contact with the conductive material should not degrade or be degraded by the conductive material), thermal constraints (e.g., the material should have a substantially high glass transition temperature and heat deflection temperature that the intermediate structure does not deform or degrade either structurally or aesthetically during post-processing or conductive material injection and processing, and form and color of the material should stay controlled after process 100), and material mechanical constraints (e.g., the bulk material should not be mechanically deformed by conductive material injection). Other material constraints can be induced by the properties of the intermediate structures (e.g. unprocessed material shall be clearable out of the channels after operation S110, if the intermediate structures are to be removed during operation S140, then the material may permit the fine structure to be printed with mechanical properties that allow for clean removal of the structure). These constraints are given as example constraints. For example, in some cases, mechanical deformation of a cavity by the conductive material injection may be desirable. Further, different constraints may be desirable for different portions of the same structure; for example, conductive traces intended to carry different electrical signals may have different material and structural requirements.

Some examples of structural constraints include cavity dimension constraints, cavity access constraints, cavity radius of curvature constraints, cavity non-intersection constraints, and structural mechanical constraints. Such constraints may be selected based on the 3D object to be formed. For example, a cavity radius of curvature may require a portion of the 3D object to have a radius of curvature of at least about 0.1 meters.

Cavity dimension constraints may include constraints on the minimum and maximum width of cavities, the minimum and maximum length of cavities. More generally, dimension constraints may include any constraints on the cavity shape.

In some examples, cavity dimension constraints may include constraints on the internal structure of cavities. For example, cavities constraints may dictate that cavities have smooth circular walls, corrugated walls, internal planes, or internal attachments, as shown in FIG. 5. Cavities may have any shape (whether irregular or irregular). Other example cavities are shown in FIGS. 6A-6C, 7, 10A-10E, 11A-11D and 12A-12C.

Cavity dimension constraints may be related to a number of other structure design considerations. For example, the roughness of cavity walls may play a role in how injected conductive material flows or coats the cavity walls. Additionally, cavity dimension constraints may affect mechanical properties (e.g., stress, strain, rigidity) or electrical properties (e.g., resistance, inductance, capacitance) of cavities and/or injected conductive material. Cavity dimensions may additionally or alternatively affect interactions between cavities and injected conductive material (e.g., induced capillary forces, material flow resistance). For example, cavities near the surface of a contact pad may be shaped to increase contact surface area, as shown in FIGS. 6A-6C and 7. Such shapes may be circular, triangular, square, rectangular, or partial shapes or combinations thereof. Cavity dimensions may also affect the way unprocessed material from operation S110 is cleared out of channels (e.g., viscous photopolymer resins can have difficulty being evacuated from channels with too thin of a diameter). Also cavity dimensions constraints can be dictated by constraints of the fabrication process or the material (e.g., in some stereolythography machines, channels under 0.5 mm may have difficulty being printed).

FIGS. 6A-6C show various views of an example of an intermediate structure with cavities having rectangular contact areas. Rectangular pads 601 are shown in FIGS. 6A and 6B. FIG. 6A shows an intermediate structure with rectangular pads 601 unfilled. The rectangular pads 601 may be connector pads for connection to other structures, which may aid in constructing larger structures with circuits. FIG. 6B shows the intermediate structure with the rectangular pads 601 filled following injection. FIG. 6C is a top view of the rectangular pads 601 following post processing.

Figure 7:
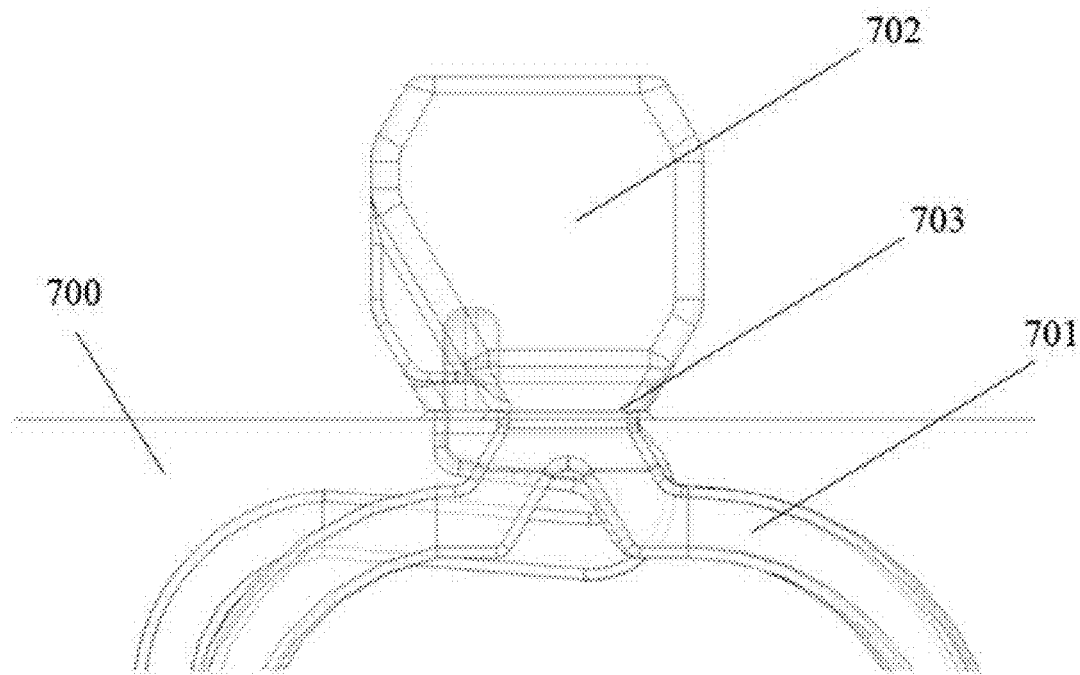
FIG. 7 is an example of an intermediate structure with cavities and a pad.

FIG. 7 shows an example view of an intermediate structure 700. The intermediate structure 700 has multiple cavities 701 in fluid communication with a support structure 702 for injection of a conductive material. A pad 703 is formed after injection. The pad 703 may provide a contact area, which may be used for electrical or thermal communication with other structures. The pad 703 may be raised with respect to a surface of the intermediate structure 700. The pad 703 may have various cross-sections, such as circular, triangular, square or rectangular. Although one pad 703 is shown, the intermediate structure 700 may have multiple pads with contact areas, such as at least 2, 3, 4, 5, 6, 7, 8, 9, 10 pads.

Cavity access constraints may mandate that the intermediate structure has an opening for each cavity, enabling conductive material to be injected into the opening. This opening, such as opening 801 of FIG. 8, for example, may be referred to as an injection port, although the opening may be used for purposes other than or in addition to injection. For example, an injection port may be used for access to cavities, injection of conductive material, ejection of conductive material, or any other use. Likewise, openings may also be designated as ejection ports (if intended for material ejection) or access ports (for other purposes).

Figure 8:
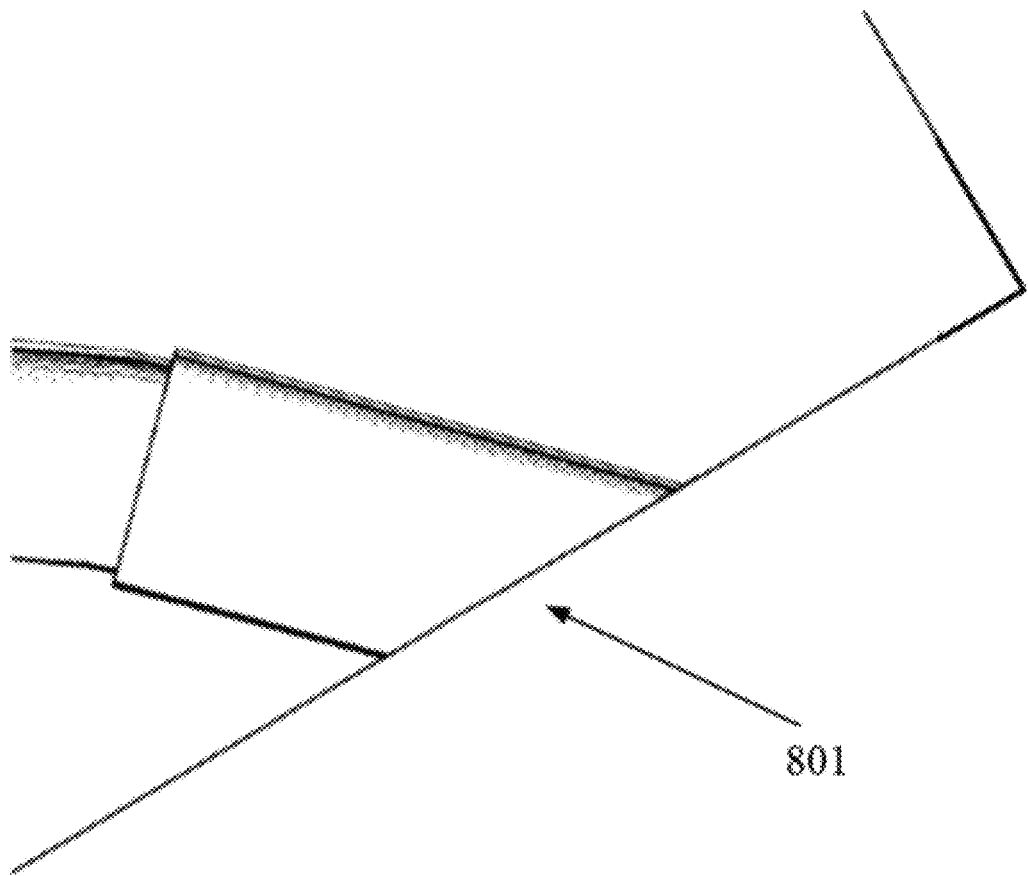
FIG. 8 is an example of a cavity injection port.

The intermediate structure may have one opening that is in fluid communication with a channel (see, e.g., FIG. 8). As an alternative, the intermediate structure may have at least 2, 3, 4, 5, 6, 7, 8, 9, 10, 20, 30, 40, or 50 openings, each in fluid communication with a channel or multiple channels. Such channel or multiple channels may permit injection, ejection or other access.

Cavity access constraints may dictate that each cavity contains an injection port and an ejection port (e.g., ports dedicated to conductive material injection and ejection) and may further dictate the location of these ports dependent on a desired or given structure.

Figure 3:
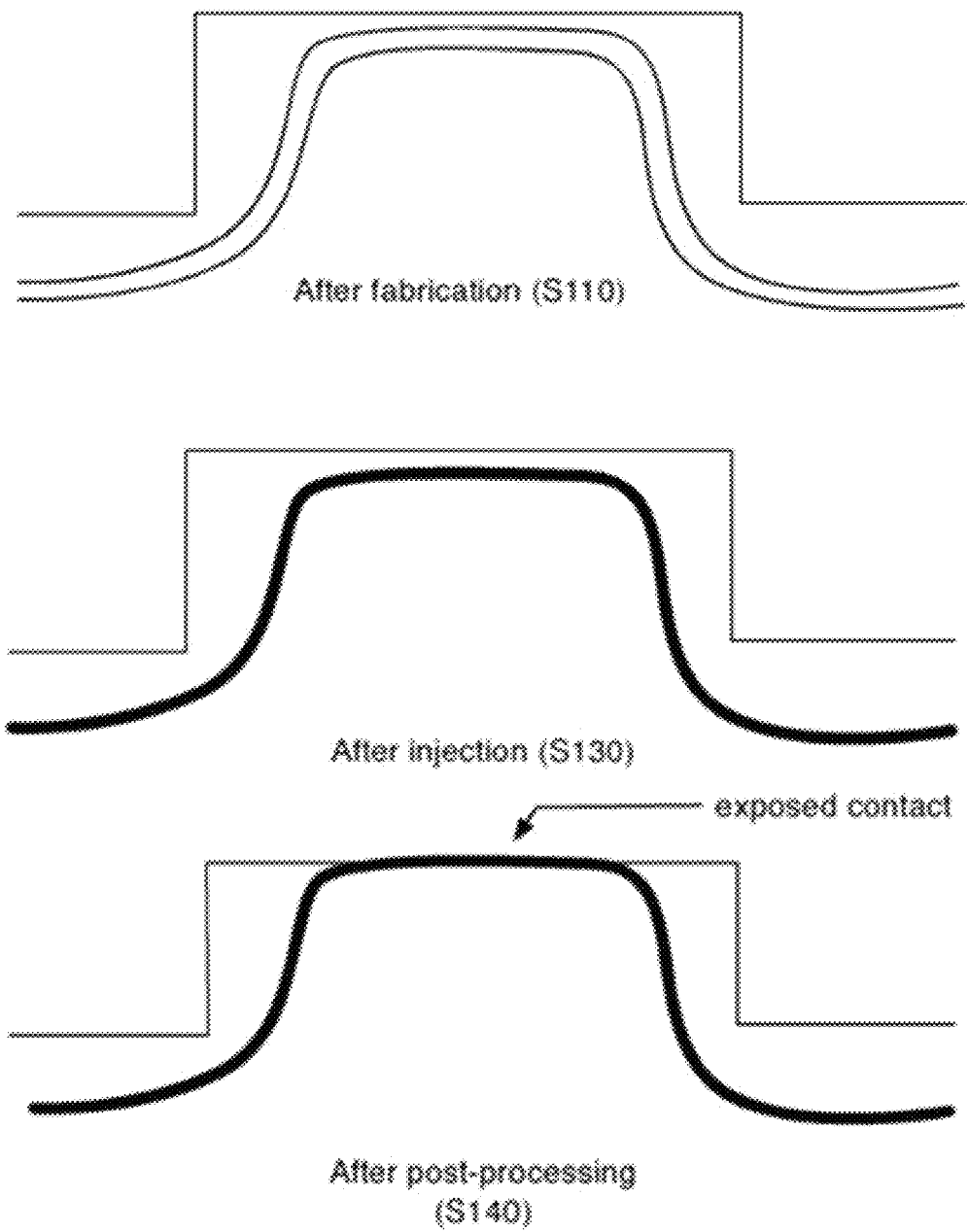
FIG. 3 is an example of a method for exposing conductive trace contact points.

Additionally or alternatively, cavity access constraints may mandate that cavities of the intermediate structure have access points. For example, the cavity has a section near the surface of the intermediate structure where a drill or mill or any other operation that removes material from the three-dimensional manufactured structure can open an injection port in post-procession operations S120 or S140. These cavity access constraints may be directed to enabling conductive material injection. Cavity access constraints may also include constraints directed to functional aspects of the conductive material. For example, cavity access constraints may dictate that cavities be near the surface of the intermediate structure in places where electrical contact to the cavities is desired, or rather, the conductive material that will eventually fill the cavities is desired. This may extend to dictating local structural constraints in such areas, such as, e.g., requiring a raised contact pad (see, e.g., FIG. 7). As shown in FIG. 3, an example structure uses such constraints, along with post-processing, to expose electrical contacts. Tabs, such those described in FIGS. 10A-10E, 11A-11D and 12A-12C, are also an example of such structural constraints.

Cavity access constraints may be linked to cavity dimension constraints or other constraints. For example, cavity access points may have particular constraints regarding shape, size, position, orientation, or any other parameter related to the access points. For example, cavity access constraints may dictate that cavity injection ports are angled and have a larger diameter than the following section of cavity (as shown in FIG. 8) in order to better accommodate an injection syringe or to increase injection performance.

Figure 9:
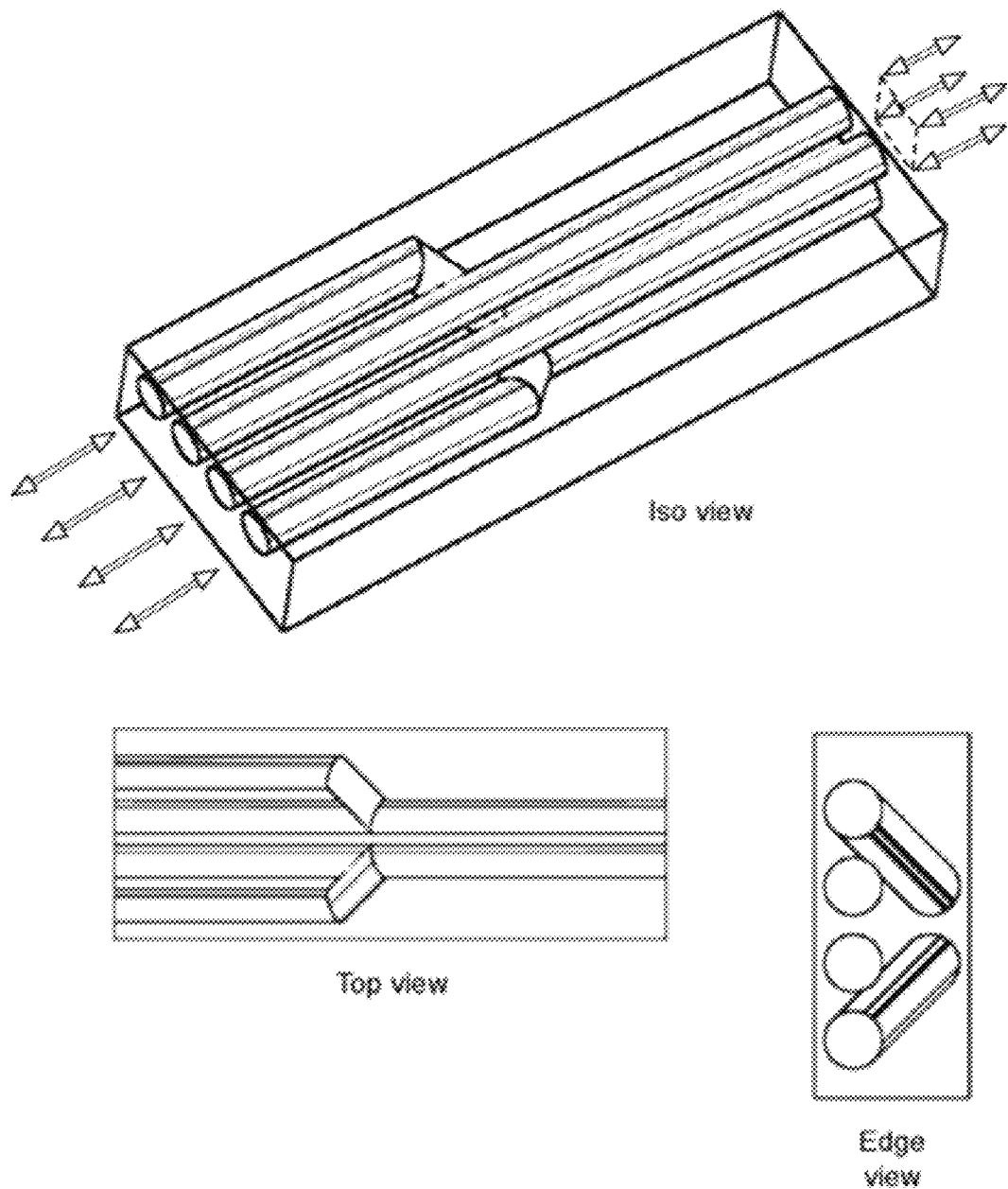
FIG. 9 shows examples of cavities of an intermediate structure.

Cavity access constraints may also include dictating multiple injection (and/or ejection, or access) ports corresponding to different three-dimensional volumes of the intermediate structure. This may allow access to various parts of the intermediate structure. In some cases, these injection ports may be designed for temporary access. The ports may be closed or covered at some point after fabrication of the intermediate structure. Multiple injection ports corresponding to different three-dimensional planes or volumes may be arranged in a single plane or volume. For example, a structure may have four injection ports arranged in a plane that correspond to at least two separate planes inside the intermediate structure, as shown in FIG. 9.

Cavity access constraints may also include dictating, the shape, dimension, orientation, location and/or diameter of a channel to allow access and continuity of the channel inside an intermediate functional structure. This may include, for example, removable tabs that allow for the creation of interconnects, removable tabs with injection of ejection ports, removable tab(s) that performs a splitting of two lines, and/or removable tab(s) with attachment fixture to monitor the injection operation S130.

Cavity radius of curvature constraints may include restrictions on the minimum radius of curvature of a cavity. Cavity non-intersection constraints may include restrictions on the intersection of cavities with other cavities or with other conductive materials in the intermediate structure. For example, cavities intended to support conductive traces carrying separate electrical signals may require electrical isolation, which may in turn require that the cavities not intersect. This may permit the conductive traces to remain electrically isolated from one another. Structural mechanical constraints may include constraints on the physical structure of the intermediate structure. In some examples, it may be undesirable for the intermediate structure to be deformed by the conductive material injection process. In an example, cavity depth should be controlled in the material to prevent damage to the substrate during post-processing, as thin areas, created by a cavity close to the surface, can be prone to deformation, fracture or discoloration. Structural mechanical constraints may be distinct from material mechanical constraints in that structural mechanical constraints may depend on both material and structure (e.g., a material in bulk may meet constraints, while a mostly hollow lattice of the same material may not). Alternatively, structural mechanical constraints may not depend on material at all.

With reference to FIG. 1, operation S120 may include post-processing the intermediate structure. Operation S120 may function to prepare the intermediate structure for the injection of conductive material. Operation S120 may include removing supports (e.g., parts of the intermediate structure used in fabrication, but not desired or otherwise intended in the final form), drying or curing, baking (i.e., exposing the intermediate structure to elevated temperatures), abrading surfaces (e.g., sanding), chemical post processing (e.g., to functionalize a surface of the substrate), or any other process that prepares the intermediate structure for conductive material injection. Operation S120 may include placing the intermediate structure in a solvent bath and sonicating the bath in order to remove undesired protrusions or roughness on structure surfaces. The solvent bath may include an alcohol, such as, for example, ethanol or isopropanol, or a peroxide, such as hydrogen peroxide. Operation S120 may additionally or alternatively include injecting solvents or chemicals into cavities of the intermediate structure and/or cleaning injection ports (via chemical, mechanical, or any suitable processes). Chemicals injected inside of a cavity may include an alcohol, such as, for example, ethanol or isopropanol, a peroxide, such as hydrogen peroxide, an acid such as a sulfuric acid or other chemicals, like potassium permanganate or any other chemical. Channels can receive a coating to prepare the channels for injection with materials, such as heat curable epoxies, release agents, anti tarnish agents or catalysts.

Figure 4:
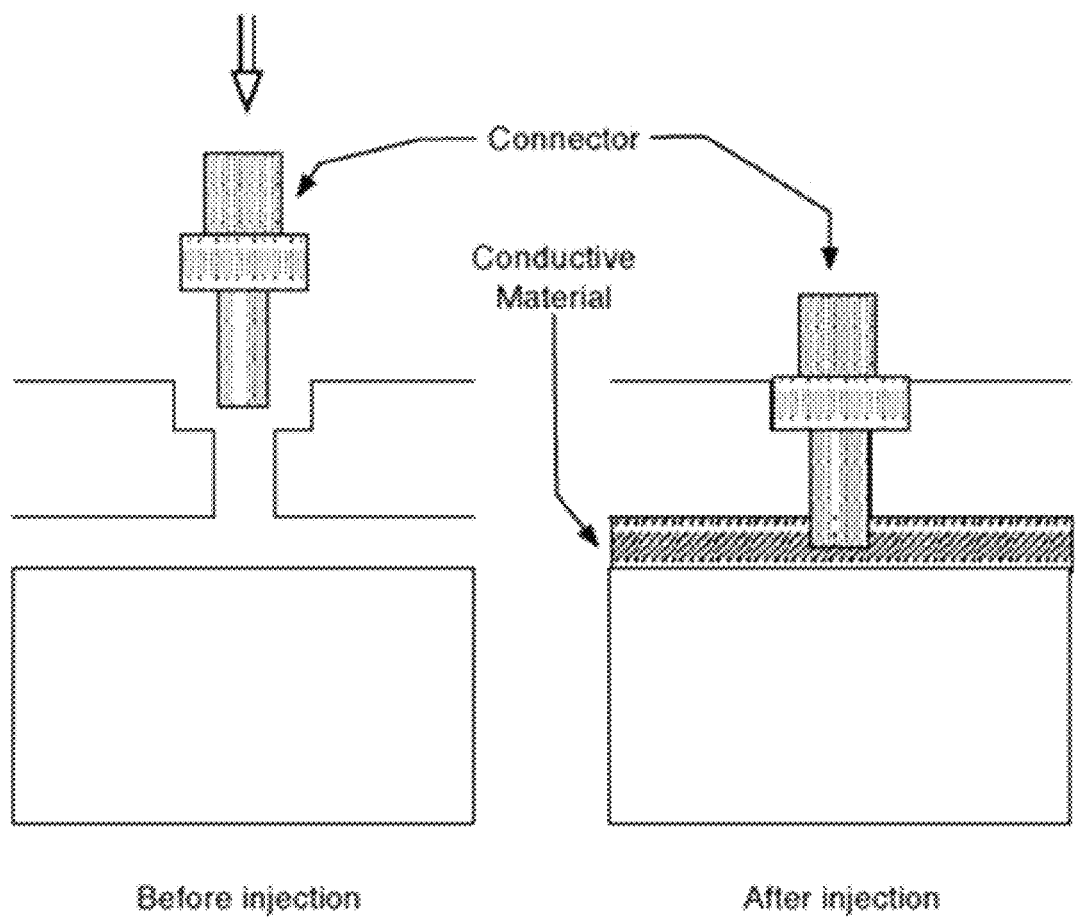
FIG. 4 is an example of adding connectors before conductive material injection.

As an alternative, operation S120 may include adding one or more connectors to allow for interfacing with conductive material, as shown in FIG. 4. The one or more connectors may be added before, during or after the conductive material is formed, for example by injection. In some cases, by adding the one or more connectors before conductive material formation, the conductive material may be able to flow around the connector while in liquid state, providing for suitable contact with the connector after conductive material curing. This may provide ohmic contact between the conductive material and the one or more connectors. This technique may be used to provide electrical access to the conductive material filling cavities for any purpose. For example, a connector may be exposed to provide access as shown in FIG. 4. As another example, a connector may contain two connection points with a capacitor between them. Such a connector may be used to capacitively couple conductive traces in two separate cavities. As another example, a connector may contain a filtering circuit or other circuitry.

Operation S120 may be performed as part of the method 100, but alternatively may not be performed if post-processing is not required.

As an alternative to fabricating an intermediate structure in operation S110, the method 100 may include receiving an intermediate structure in operation S150. The intermediate structure received in operation S150 may undergo post-processing in operation S120. The intermediate structure of operation S150 may be substantially similar to the intermediate structure of operation S110, but may additionally or alternatively be any suitable structure.

Operation S130 may include injecting conductive material into the intermediate structure. Operation S130 may function to form conductive traces by filling cavities in the intermediate structure with a conductive material.

Injection of material through operation S130 may be performed through the use of intermediate functional structures (e.g., removable tab with embedded injection or ejection port) as described, for example, in FIGS. 11A-11E.

Figure 11A:
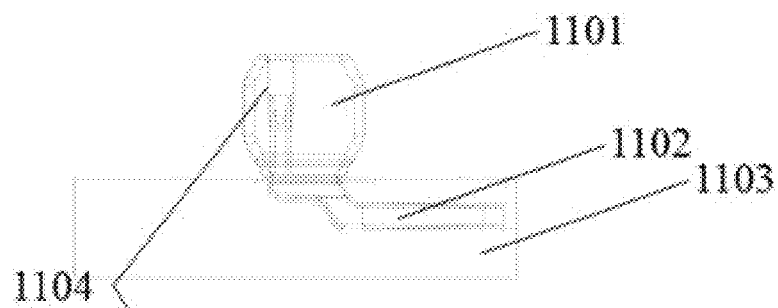
FIGS. 11A-11D schematically illustrate an example of a breakable structure with injection ports.
Figure 11B:
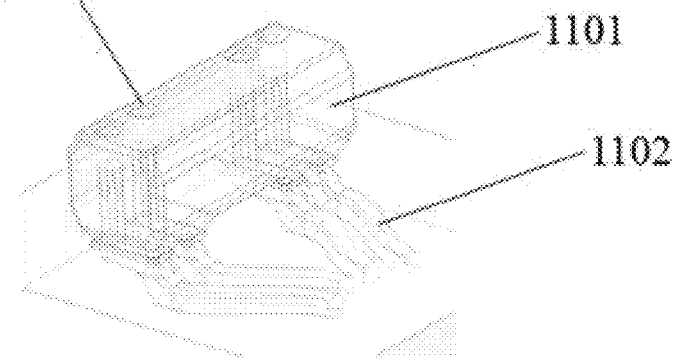
Figure 11C:
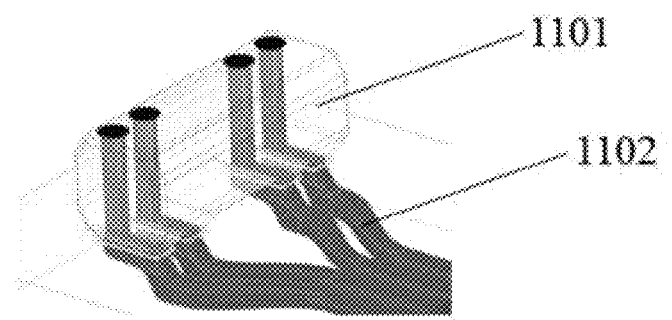
Figure 11D:
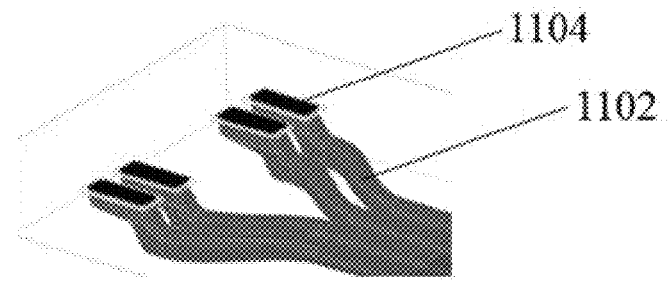

FIG. 11A shows a side view of an injection structure 1101 that is unfilled. The injection structure 1101 can include one or more injection and/or ejection ports. The injection structure 1101 can be a breakable tab. The injection structure 1101 is in fluid communication with channels 1102 in an intermediate structure 1103. FIG. 11B shows a perspective side view of the injection structure 1101 in fluid communication with the channels 1102 in the intermediate structure 1103. Conductive material may be injected through an injection port 1104 in the injection structure 1101 to fill the channels 1102, as shown in FIG. 11C. Once the channels 1102 have been filled, the injection structure 1101 may be broken to yield contacts 1105, as shown in FIG. 11D.

The conductive material injected in operation S130 may be an epoxy or other paste or viscous liquid that can be injected into cavities of the intermediate structure and can then be cured to solidify the paste/liquid. The conductive material may be any suitably conductive material with the above properties. The flow of the conductive material may have a Reynolds number below 30000, 10000, 4000, 3000, 2000, or 1000. The conductive material may have a viscosity of at least about 0.001 Pascal seconds (Pa s), 0.01 Pa·s, 0.1 Pa·s, 1 Pa s, 1.5 Pa s, 2 Pa s, 10 Pa·s, 50 Pa·s. The viscosity may be from about 0.001 Pa s to 10 Pa s, or 0.01 Pa s to 100 Pa s. For example, the conductive material may be an epoxy containing a conductive filler, which may be formed, for example, from the reaction of an epoxy resin and one or more metallic particles (e.g., flakes, micro-beads, or nanoparticles), which may be mixed with a hardener. The one or more metallic particles may include particles formed of one or more material selected from copper, aluminum, beryllium, magnesium, molybdenum, zinc, cobalt, cadmium, lithium, ruthenium, lead, bismuth, tin, indium, tungsten, iron, nickel, ruthenium, rhodium, palladium, silver, osmium, iridium, platinum, and gold. The conductive filler may be micronized. As another example, the conductive material may be a material deposited as part of a multi-part (e.g., two-part) catalysis or plating process. Other examples of conductive materials include thermally curable conductive polymer, ultraviolet light curable conductive polymer, heat curable conductive silicon, moisture curable silicon, low melting point temperature metals, molten metals, conductive biomaterials and bendable metal wire.

The conductive material may be formed from a one-part self-curing epoxy prepared prior to injection in the intermediate structure; additionally or alternatively, in the case of two part epoxy materials, the conductive material may be mixed shortly before or during the injection process (e.g., by injecting epoxy resin and catalyst/hardener simultaneously or in alternating pulses). The conductive material may be self-curing (i.e., the material is formed by curing at room temperature). Additionally or alternatively, the conductive material may be cured at higher temperatures (e.g., in an oven), such as, for example, by flowing current through the conductive material (e.g., continuous current at high amperage or short pulses at high voltage), by light (e.g., an ultraviolet lamp), or a combination thereof, or any other process necessary for the proper curing of the material while maintaining the integrity of the 3D structure.

Operation S130 may include injecting an un-cured (e.g., liquid/paste form) conductive material into the intermediate structure using a syringe or a pump system. Additionally or alternatively, operation S130 may include the use of a functional intermediate structure to connect to the injection system (e.g., tab with injection port or ejection port), as described, for example, in FIG. 11A-11E. Additionally or alternatively, operation S130 may include any suitable method of flowing the un-cured conductive material into the cavities of the intermediate structure. For example, conductive material may be heated to achieve low viscosity and poured into cavities, sucked into cavities, or sprayed into cavities. In another example, a vacuum system may use an ejection port to create a pressure differential between a cavity and a conductive material present at an injection port, resulting in conductive material entering the cavity. Material flow may be additionally or alternatively induced by other techniques, including alternative methods of inducing pressure differentials, application of electromagnetic forces, presence of capillary forces, and/or any other suitable technique.

Operation S130 may include monitoring injection parameters S131. Monitoring injection parameters S131 may provide information about the injection process and/or the material being injected in operation S130. For example, operation S131 may include monitoring injection flow rate (e.g., the flow rate of material leaving a delivery device, such as a syringe tip), injection mass (e.g., the amount of material injected into the intermediate structure), injection pressure (e.g., the local pressure at the syringe tip or at some point in a cavity), injection temperature, or other suitable injection process parameters. Operation S131 may also include monitoring other parameters. For example, operation S131 may include measuring the electrical properties of a volume of conductive material (e.g., resistance, capacitance, or inductance). Operation S131 may include monitoring injection parameters before injection (e.g., monitoring temperature of conductive material pre-injection), during injection (e.g., monitoring flow rate during injection), or after injection (e.g., monitoring resistance across two cavity points as conductive material cures).

Monitoring as described in operation S131, for example, can be performed using apparatus attached to intermediate structures, allowing the local monitoring of injection parameters, such as injection flow rate (e.g., the flow rate of conductive material leaving at some local point in the cavity), injection mass (e.g., an amount of conductive material injected into the intermediate structure), injection pressure (e.g., a local pressure at some point in a cavity), injection temperature, a level of fill of a cavity (e.g., verifying that conductive material is present at the ejection port, which may signify that the channel has been completely filled), or other suitable injection process parameters. An example of such sensor attachment is presented in FIGS. 12A-12C.

With reference to FIG. 1, operation S130 may additionally include modifying injection parameters S132. Operation S132 may adapt controllable injection parameters during injection in order to modify properties of the conductive material (e.g., resistivity, viscosity, density, etc.). Operation S132 may be performed in response to operation S131 (e.g., parameters are adapted using a feedback process to reach a desired or predetermined result) or in response to a recipe or algorithm (e.g., flow rate is slowly increased over time in order to optimize or maximize cavity filling).

Controllable injection parameters may include injection flow rate, material temperature, material composition (e.g., changing a ratio of epoxy resin to hardener, changing amount of metal or other conductive agent present in the epoxy resin, or changing material entirely), injection pressure, injection viscosity, injection location, or any other suitable controllable parameter related to conductive material injection.

In some cases, an interior surface of a cavity may be coated in a conductive material. This may be performed in a similar manner to conductive material injection, but may alternatively be done in another way, such as by electroless plating. The interior surface may then be grounded or otherwise connected to a voltage/current source. Then, as conductive material is injected or shortly thereafter, an electric potential may be applied to the conductive material, such that current flows through the conductive material to the grounded surface. The electric potential can also be applied in short pulses to facilitate the dissipation of any heat that may be generated by Joule heating. In situations in which current flow results in heating, such heating may be used to modify properties of the conductive material or to induce the curing of the conductive material. The voltage and/or current/power may be controlled as part of operation S132.

In some cases, operation S130 may also include injecting nonconductive material along with conductive material. The materials may be injected simultaneously in a mix and varied as part of operation S132 in order to vary the conductivity of the injected material. Additionally or alternatively, the materials may be injected serially. For example, a short injection of insulating material between two injections of conductive material may be used to create an intra-cavity capacitor. Changes to material may be controlled in operation S132.

Operation S140 may include post-processing the injected structure. Operation S140 may function to perform any operation on the injected structure, which may be the intermediate structure after performing conductive material injection. Such operations may be necessary or desired to create the completed 3D structure. In some cases, operation S140 may be precluded. For example, in situations in which a self-curing epoxy is used, which may not require any post-baking, no post-processing may be necessary. Operation S140 may include various operations, such as: removing excess conductive material (e.g., by polishing, wiping, milling, or drilling); exposing the injected structure to light and/or heat (e.g., by a convection oven, a microwave oven or an infrared oven, and/or UV lamp); drying, curing or baking; exposing the injected structure to one or more solvents; abrading surfaces (e.g., sanding), which may be used to expose contact surfaces; applying electric potential continuously or in pulses to create Joule heating; exposing contact surfaces (e.g., as shown in FIG. 3); adding connectors, which may be similar to the connectors shown in FIG. 4, but added after injection; and/or any other process desired for the completed structure.

In some cases, in operation S130, the intermediate structure may be injected with a conductive material that comprises a one-part epoxy material. The epoxy material may include one or more metals, such as silver. In operation S140, the intermediate structure may then be processed in a multistep (e.g., two-step) curing process. First, the intermediate structure may be heated at a first temperature (e.g., 75° C. or under) in a convection oven or any other appropriate heating apparatus. Such processing may allow the epoxy, which may have a substantially low conductivity when unprocessed, to reach or exceed its percolation threshold, allowing it to reach a first resistivity plateau. After heating at the first temperature for a time period (e.g., at least about 30 minutes, 1 hour or 2 hours), the conductive material in the intermediate structure may be exposed at one end of the intermediate structure (e.g., grounded at one end of the intermediate structure) and an electrical potential may be applied at another end of the intermediate structure. In such a case, the flow of electrical current (e.g., up to about 20 amperes) through the conductive material may generate Joule heating of the conductive material, which may allow rapid, local and high quality final curing of the epoxy. Additional post processing may then be performed as part of operation S140.

Additional post processing of the injected parts can include removal of temporary intermediate functional structures, which may be removed from the injected part either manually (e.g., by tilting the intermediate structure, such as when a tab creates a fracture that allows the removal of the structure), with tooling, or any other post processing operation, as necessary (e.g. using tweezers, clamps, milling, drilling, and/or laser cutting). The breaking off of the temporary functional intermediate structures can have aesthetic benefits, and may allow a final object without unnecessary visible functional structures (e.g., removing the injection port or ejection port) or fixtures. This operation of removing the intermediate functional structure may also yield a final functional structure, such as by exposing an interconnect or splitting a line in isolated lines or any other function allowed by the geometry of the removable intermediate structure (see, e.g., FIG. 10).

Operation S140 may additionally or alternatively include adding more material to the injected structure. For example, an injected structure may be returned to a 3D printer after injection in order to cover injection ports or to add more features.

In some cases, operation S140 may include adding electronics to the injected structure. For example, a microprocessor may be added to a socket connector added during operation S130 or operation S140. The microprocessor may then be covered with a polymer (e.g., thermoplastic or photopolymer) to seal it into the injected structure.

Computer Systems

Figure 15:
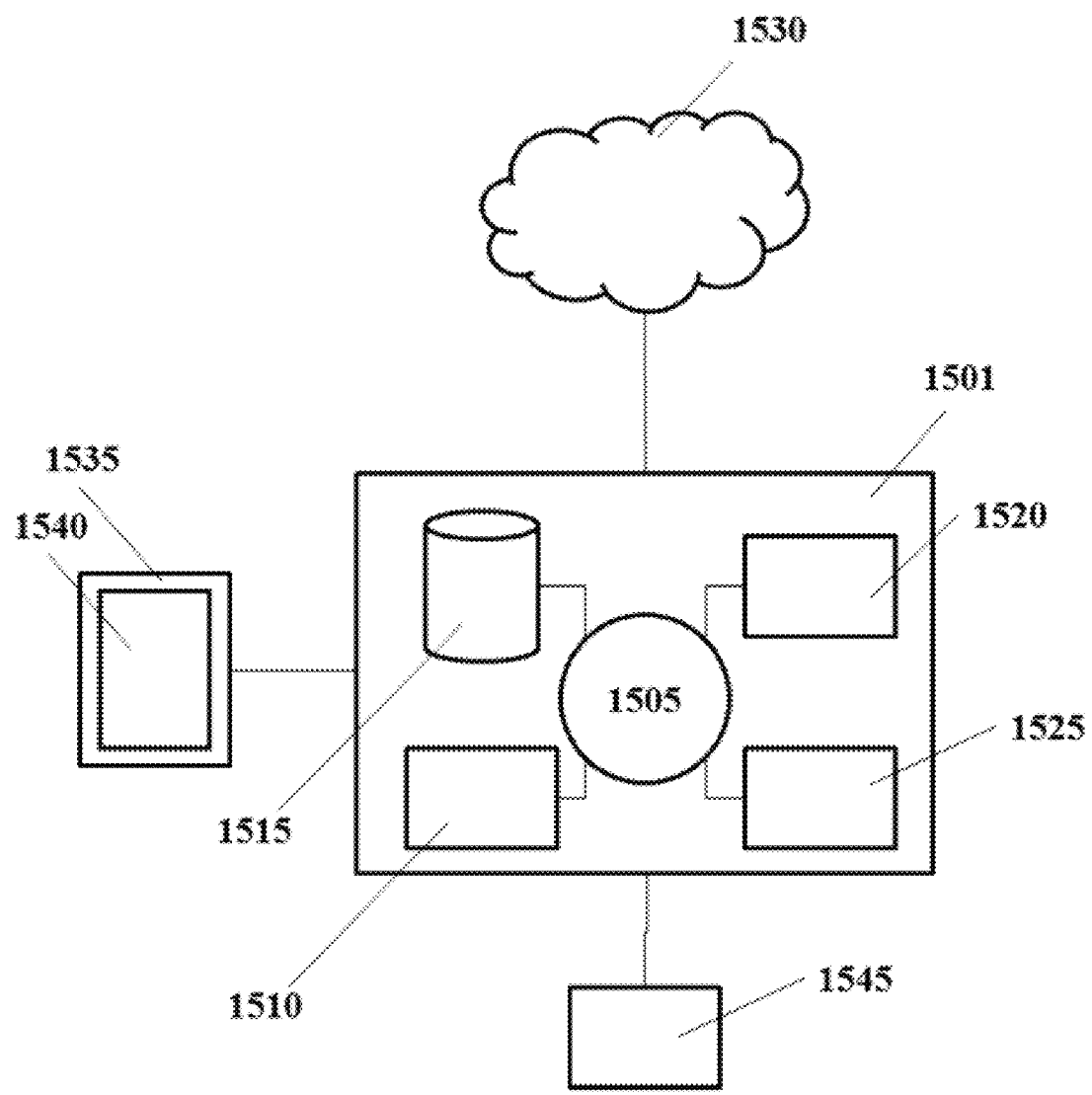
FIG. 15 shows a computer system that is programmed or otherwise configured to implement methods of the present disclosure.

The present disclosure provides computer control systems that are programmed to implement methods of the disclosure. FIG. 15 shows a computer system 1501 that includes a central processing unit (CPU, also "processor" and "computer processor" herein) 1505, which can be a single core or multi core processor, or a plurality of processors for parallel processing. The computer system 1501 also includes memory or memory location 1510 (e.g., random-access memory, read-only memory, flash memory), electronic storage unit 1515 (e.g., hard disk), communication interface 1520 (e.g., network adapter) for communicating with one or more other systems, and peripheral devices 1525, such as cache, other memory, data storage and/or electronic display adapters. The memory 1510, storage unit 1515, interface 1520 and peripheral devices 1525 are in communication with the CPU 1505 through a communication bus (solid lines), such as a motherboard. The storage unit 1515 can be a data storage unit (or data repository) for storing data. The computer system 1501 can be operatively coupled to a computer network ("network") 1530 with the aid of the communication interface 1520. The network 1530 can be the Internet, an internet and/or extranet, or an intranet and/or extranet that is in communication with the Internet. The network 1530 in some cases is a telecommunication and/or data network. The network 1530 can include one or more computer servers, which can enable distributed computing, such as cloud computing. The network 1530, in some cases with the aid of the computer system 1501, can implement a peer-to-peer network, which may enable devices coupled to the computer system 1501 to behave as a client or a server.

The CPU 1505 can execute a sequence of machine-readable instructions, which can be embodied in a program or software. The instructions may be stored in a memory location, such as the memory 1510. The instructions can be directed to the CPU 1505, which can subsequently program or otherwise configure the CPU 1505 to implement methods of the present disclosure. Examples of operations performed by the CPU 1505 can include fetch, decode, execute, and writeback.

The CPU 1505 can be part of a circuit, such as an integrated circuit. One or more other components of the system 1501 can be included in the circuit. In some cases, the circuit is an application specific integrated circuit (ASIC).

The storage unit 1515 can store files, such as drivers, libraries and saved programs. The storage unit 1515 can store user data, e.g., user preferences and user programs. The computer system 1501 in some cases can include one or more additional data storage units that are external to the computer system 1501, such as located on a remote server that is in communication with the computer system 1501 through an intranet or the Internet.

The computer system 1501 can communicate with one or more remote computer systems through the network 1530. For instance, the computer system 1501 can communicate with a remote computer system of a user. Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system 1501 via the network 1530.

Methods as described herein can be implemented by way of machine (e.g., computer processor) executable code stored on an electronic storage location of the computer system 1501, such as, for example, on the memory 1510 or electronic storage unit 1515. The machine executable or machine readable code can be provided in the form of software. During use, the code can be executed by the processor 1505. In some cases, the code can be retrieved from the storage unit 1515 and stored on the memory 1510 for ready access by the processor 1505. In some situations, the electronic storage unit 1515 can be precluded, and machine-executable instructions are stored on memory 1510.

The code can be pre-compiled and configured for use with a machine having a processor adapted to execute the code, or can be compiled during runtime. The code can be supplied in a programming language that can be selected to enable the code to execute in a pre-compiled or as-compiled fashion.

Methods of the present disclosure can be embodied in and/or implemented at least in part by a machine programmed or otherwise configured to receive a computer-readable medium storing computer-readable instructions. The instructions may be executed by computer-executable components that may be integrated with a 3D printer and/or an injection device or system, such as an injection syringe. The computer-readable medium can be stored on any suitable computer-readable media such as RAMs, ROMs, flash memory, EEPROMs, optical devices (CD or DVD), hard drives, floppy drives, or any suitable device. The computer-executable component may be a general or application specific processor, but any suitable dedicated hardware or hardware/firmware combination device can alternatively or additionally execute the instructions.

Aspects of the systems and methods provided herein, such as the computer system 1501, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 1501 can include or be in communication with an electronic display 1535 that comprises a user interface (UI) 1540 for providing, for example, a design specification of a 3D object for manufacturing (e.g., printing, machining, molding), including one or more intermediate structures. Examples of UI's include, without limitation, a graphical user interface (GUI) and web-based user interface.

The computer system 1501 can include or be in communication with a 3D structure manufacturing system (or module) 1545. The 3D manufacturing system 1545 can generate a 3D object via additive or subtractive manufacturing, for example. The 3D structure manufacturing system 1545 can be a 3D printing system and can additively generate a 3D object of various materials, such as a polymeric material. An example of a 3D printing system 1545 is provided in U.S. Pat. No. 7,520,740 to Wahlstrom et al., which is entirely incorporated herein by reference. The 3D structure manufacturing system 1545 can be a CNC machining and can subtractively generate a 3D structure from various materials, such as a plastics or metals. Another example of the 3D structure manufacturing system 1545 is provided in WO/2015/127271 to Hyatt et al. which is entirely incorporated herein by reference.

Methods and systems of the present disclosure can be implemented by way of one or more algorithms. An algorithm can be implemented by way of software upon execution by the central processing unit 1505. The algorithm can, for example, facilitate the formation of a 3D object per method 100 of FIG. 1. The algorithm can implement various operations of the method 100.

Methods and systems of the present disclosure can be used to form various three-dimensional objects, such as, for example, electronics devices, microfluidic devices, mechanical devices, medical devices, propulsion devices, architectural structure, buildings, radio-communication devices, bioengineered structures, artificial organs or biomedical devices. Such three-dimensional objects may be used in various settings, such as commercial, industrial, or military settings.

Methods and systems of the present disclosure may be combined with other methods and systems, such as, for example, those described in EP 1209959, EP 2779272, U.S. Patent Publication No. 2002/0062987, U.S. Patent Publication No. 2011/0253435, U.S. Patent Publication No. 2014/0054795, U.S. Patent Publication No. 2014/0272522, U.S. Pat. No. 6,100,178, U.S. Pat. No. 6,833,511, and U.S. Pat. No. 8,033,014 each of which is entirely incorporated herein by reference.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A method for forming a three-dimensional object with at least one conductive trace, comprising:
   injecting a solution comprising a first material into an injection structure of an intermediate structure, the intermediate structure comprising at least one predefined location for at least one conductive trace, the intermediate structure made of a second material having an electrical and/or thermal conductivity that is less than the first material, the first material injected into the at least one predefined location of the intermediate structure via the injection structure to form the at least one conductive trace after the intermediate structure that includes the injection structure is additively formed thereby forming the three-dimensional object with the at least one conductive trace, the intermediate structure, and the injection structure;

removing the injection structure from the intermediate structure subsequent to the first material being injected into the at least one predefined location of the intermediate structure; and curing the solution comprising the first material that was injected into the at least one predefined location of the intermediate structure.

2. The method of claim 1, wherein the second material is a polymeric, ceramic, organic, composite, metallic, mineral or living material.

3. The method of claim 1, wherein the first material is a metal, metal filled polymer or organic conductive material.

4. The method of claim 1, wherein the solution is cured by directing an electrical current through the solution to generate Joule heating.

5. The method of claim 1, wherein the at least one predefined location is a channel, and wherein the solution that includes the first material is injected in at least a portion of the channel.

6. The method of claim 1, wherein the injection structure comprises an injection channel in fluid communication with the at least one predefined location, and the first material is injected to the at least one predefined location through the injection channel of the injection structure.

7. The method of claim 6, further comprising using one or more sensors adjacent to the injection structure to monitor one or more injection parameters while injecting the solution.

8. The method of claim 7, further comprising adjusting the one or more injection parameters while injection the solution.

9. The method of claim 6, further comprising ejecting the solution using the injection structure.

10. The method of claim 1, wherein the first material has an electrical conductivity that is greater than an electrical conductivity of the second material.

11. The method of claim 1, wherein the at least one conductive trace comprises a plurality of conductive traces.

12. The method of claim 11, wherein a given one of the plurality of conductive traces is electrically isolated from another one of said plurality of conductive traces.

13. The method of claim 11, wherein each of said plurality of conductive traces includes a contact pad at an external surface of the intermediate structure for electrical and/or thermal connectivity.

14. The method of claim 1, wherein the at least one conductive trace is within the intermediate structure, and the method further comprising exposing at least a portion of said at least one conductive trace.

15. The method of claim 1, wherein a model design for the intermediate structure includes one or more structural constraints for the at least one predefined location.

16. The method of claim 1, further comprising bringing an electrical circuit in electrical contact with the at least one conductive trace.

17. The method of claim 1, wherein removing the injection structure comprises breaking the injection structure from the intermediate structure.

* * * * *

UNITED STATES PATENT AND TRADEMARK OFFICE
CERTIFICATE OF CORRECTION

PATENT NO. : 10,039,195 B2
APPLICATION NO. : 14/921868
DATED : July 31, 2018
INVENTOR(S) : Baback Elmieh et al.

Page 1 of 1

It is certified that error appears in the above-identified patent and that said Letters Patent is hereby corrected as shown below:

In the Claims

Column 21, Line 29, Claim 8 after "while" delete "injection" and insert -- injecting --.

Signed and Sealed this
Twenty-second Day of January, 2019

Andrei Iancu
*Director of the United States Patent and Trademark Office*